United States Patent
Oehen et al.

(10) Patent No.: US 11,239,056 B2
(45) Date of Patent: Feb. 1, 2022

(54) MULTIPLEXED POWER GENERATOR OUTPUT WITH CHANNEL OFFSETS FOR PULSED DRIVING OF MULTIPLE LOADS

(71) Applicant: Advanced Energy Industries, Inc., Fort Collins, CO (US)

(72) Inventors: Joel Oehen, Corminboeuf (CH); Alain Richoz, Bulle (CH); Fabio Vicinanza, Sarzans (CH)

(73) Assignee: Advanced Energy Industries, Inc., Fort Collins, CO (US)

( * ) Notice: Subject to any disclaimer, the term of this patent is extended or adjusted under 35 U.S.C. 154(b) by 9 days.

(21) Appl. No.: 16/942,566

(22) Filed: Jul. 29, 2020

(65) Prior Publication Data

US 2021/0035778 A1    Feb. 4, 2021

Related U.S. Application Data

(60) Provisional application No. 62/880,074, filed on Jul. 29, 2019.

(51) Int. Cl.
  *H01J 37/32* (2006.01)
  *H03K 3/017* (2006.01)

(52) U.S. Cl.
  CPC .. *H01J 37/32146* (2013.01); *H01J 37/32165* (2013.01); *H03K 3/017* (2013.01)

(58) Field of Classification Search
  None
  See application file for complete search history.

(56) References Cited

U.S. PATENT DOCUMENTS

| | | | |
|---|---|---|---|
| 6,304,473 B1 | 10/2001 | Telefus et al. | |
| 6,340,416 B1 * | 1/2002 | Goedicke | H01J 37/34 |
| | | | 204/192.12 |
| 6,760,675 B1 | 7/2004 | Szwec et al. | |
| 6,818,562 B2 | 11/2004 | Todorow et al. | |
| 6,898,262 B1 | 5/2005 | Yokokawa | |
| 6,911,809 B2 | 6/2005 | Kernahan | |

(Continued)

FOREIGN PATENT DOCUMENTS

| | | |
|---|---|---|
| DE | 102010005799 B4 | 8/2016 |
| EP | 2387823 A1 | 11/2011 |

(Continued)

OTHER PUBLICATIONS

Dr. Nidhal Odeh, "International Search Report and Written Opinion Regarding International Application No. PCT/US2020/044104", dated Sep. 8, 2020, p. 12, Published in: AU.

*Primary Examiner* — Amy Cohen Johnson
*Assistant Examiner* — James H Cho
(74) *Attorney, Agent, or Firm* — Neugeboren O'Dowd PC

(57) ABSTRACT

This disclosure describes systems, methods, and apparatus for a pulsed power supply assembly that distributes pulsed power to two or more loads using a single pulsed power supply. A pulsed power supply of the assembly can phase shift pulses to the different loads to ensure that there is no overlap between pulses at the outputs even where target frequencies and/or duty cycles for the different loads would otherwise call for such pulse overlaps. Variances applied by the pulsed power supply can be limited by attempts to keep average parameters of the pulse trains provided to the different loads to within predetermined variances.

19 Claims, 22 Drawing Sheets

(56) References Cited

U.S. PATENT DOCUMENTS

| | | |
|---|---|---|
| 6,962,644 B2 | 11/2005 | Paterson et al. |
| 7,321,344 B2 | 1/2008 | Sekii |
| 7,586,210 B2 | 9/2009 | Wiedemuth et al. |
| 7,586,486 B2 | 9/2009 | Sasaki et al. |
| 7,663,319 B2 | 2/2010 | Chistyakov et al. |
| 7,671,619 B2 | 3/2010 | Lin et al. |
| 7,898,183 B2 | 3/2011 | Chistyakov et al. |
| 7,920,023 B2 | 4/2011 | Witchard |
| 8,025,932 B2 | 9/2011 | Wolden et al. |
| 8,043,487 B2 | 10/2011 | Li et al. |
| 8,272,348 B2 | 9/2012 | Suzuki |
| 8,289,010 B1 * | 10/2012 | Fernald ............ H02M 3/156 323/283 |
| 8,992,724 B2 | 3/2015 | Kanazawa et al. |
| 9,210,748 B2 | 12/2015 | Evans et al. |
| 9,502,217 B2 | 11/2016 | Kanazawa et al. |
| 9,704,692 B2 | 7/2017 | Leeser |
| 9,721,758 B2 | 8/2017 | Coumou et al. |
| 9,853,544 B2 | 12/2017 | Govindaraj et al. |
| 10,277,129 B2 * | 4/2019 | Govindaraj ........ B60L 50/16 |
| 10,553,465 B2 | 2/2020 | Augustyniak et al. |
| 10,679,867 B2 | 6/2020 | Yamazawa |
| 10,910,203 B2 * | 2/2021 | Pelleymounter ...... C23C 14/35 |
| 2004/0089227 A1 | 5/2004 | Wang |
| 2004/0263437 A1 | 12/2004 | Hattori |
| 2008/0210545 A1 | 9/2008 | Kouznetsov |
| 2011/0038187 A1 | 2/2011 | Horishita et al. |
| 2013/0059448 A1 | 3/2013 | Marakhtanov et al. |
| 2017/0062190 A1 | 3/2017 | Lee et al. |
| 2017/0071053 A1 | 3/2017 | Lee et al. |
| 2017/0186586 A1 | 6/2017 | Oh et al. |
| 2018/0374672 A1 * | 12/2018 | Hayashi ................ H01J 37/24 |
| 2018/0374689 A1 | 12/2018 | Abraham et al. |
| 2019/0081558 A1 | 3/2019 | Kilani et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0118856 A1 | 4/2020 | Augustyniak et al. |
| 2020/0227237 A1 | 7/2020 | Marakhtanov et al. |

FOREIGN PATENT DOCUMENTS

| | | |
|---|---|---|
| EP | 3396700 A1 | 10/2018 |
| EP | 3503368 A1 | 6/2019 |
| EP | 3568662 A2 | 11/2019 |
| EP | 3616232 A1 | 3/2020 |
| EP | 3616233 A1 | 3/2020 |
| EP | 3616234 A1 | 3/2020 |
| EP | 3671805 A1 | 6/2020 |
| GB | 2433167 B | 11/2007 |
| JP | 5638617 B2 | 12/2014 |
| JP | 6653577 B2 | 2/2020 |
| KR | 900017269 A | 11/1990 |
| KR | 101497234 B1 | 2/2015 |
| KR | 1020150139461 A | 12/2015 |
| KR | 101872395 B1 | 6/2018 |
| WO | 2018107392 A1 | 6/2018 |
| WO | 2018178289 A1 | 10/2018 |

* cited by examiner

MULTIPLEXED POWER GENERATOR OUTPUT WITH CHANNEL OFFSETS FOR PULSED DRIVING OF MULTIPLE LOADS

CLAIM OF PRIORITY UNDER 35 U.S.C. § 119

The present application for Patent claims priority to Provisional Application No. 62/880,074 entitled "MULTIPLEXED POWER GENERATOR OUTPUT WITH CHANNEL OFFSETS FOR PULSED DRIVING OF MULTIPLE LOADS" filed Jul. 29, 2019, and assigned to the assignee hereof and hereby expressly incorporated by reference herein.

FIELD OF THE DISCLOSURE

The present disclosure relates generally to pulsed power supplies. In particular, but not by way of limitation, the present disclosure relates to systems, methods and apparatuses for driving multiple loads using a single pulsed generator.

DESCRIPTION OF RELATED ART

Existing plasma enhanced chemical vapor deposition (PECVD) processes use separate power supplies for each of multiple chambers. Each chamber may include a separate wafer "boat" and is considered a distinct power load. Each generator typically provides a low duty cycle pulsed signal with high power delivery during each pulse. Each load can utilize a different recipe and each recipe can change the frequency, duty cycle, and power of the pulses over time. One drawback of this design is that each power supply is typically limited to providing power no more than around 10% of the time. There is thus a need for more efficient utilization of these power supplies.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

To overcome the challenges of powering multiple loads with multiple power supplies, in one aspect of the disclosure, a power supply assembly is disclosed providing full power to multiple loads via multiplexing, wherein pulses to each of the multiple loads can be phased to avoid overlap between different channels. In an embodiment, a multiplexing unit attached to an output of a power supply can multiplex, or distribute, pulses from the power supply into multiple channels (or distributed pulse trains), each of the channels provided to a distinct one of the multiple loads. In some embodiments, these loads can include one or more electrodes of a plasma processing chamber. Since the recipes for the different loads may call for different frequencies or pulsing, or may change over time such that different frequencies of different loads at the same time are seen, beat frequencies and channel overlap can occur. Channel overlap can lead to excessive power draw and either poor power delivery or damage to the power supply. To avoid this, the pulsed power supply or multiplexing unit can adjust or phase the timing of pulses when there are channel overlaps, while still maintaining a desired average duty cycle for each channel. In this way a single power supply can provide power to multiple pulsed loads while still achieving desired film properties (e.g., PECVD, PVD, CVD, to name just three).

Some embodiments of the disclosure can be characterized as a pulsed power supply assembly. The assembly can include a multiplexing unit and a pulsed power supply. The multiplexing unit can include tow or more pulsed outputs each configured for coupling to one of two or more loads. The multiplexing unit can further include a power distribution switching assembly coupled to an input of the multiplexing unit and the two or more pulsed outputs. The power distribution switching assembly can be configured to split pulses from a pulse train received at the input into distributed pulses at the two or more pulsed outputs. The pulsed power supply can be configured to provide the pulse train to the input of the multiplexing unit. The pulsed power supply can comprise a periodic pulse generator, phase shift circuitry, a memory, and a processing portion. The phase shift circuitry can be coupled to an output of the periodic pulse generator and can be coupled to an output of the pulsed power supply. The memory can store target parameters (e.g., frequency, duty cycle, conduction time, on time, off time, start time, etc.) for each of the two or more loads. The processing portion can be coupled to the memory and can be configured to read processor executable instructions on the memory that when executed, cause the processing portion to access the target parameters in the memory and generate a schedule of distributed pulses for the multiplexing unit. They also cause the processing portion to predict instances of overlap between the distributed pulses in the schedule. They further cause the processing portion to generate a new schedule that avoids the overlaps and instruct the phase shift circuitry to modify a periodic pulse train from the periodic pulse generator to generate the pulse train such that the pulse train aligns with the new schedule.

Other aspects of the disclosure can be characterized as a pulsed power supply assembly configured to couple to and drive two or more loads. The assembly can include a multiplexing unit and a pulsed power supply. The multiplexing unit can comprise two or more pulsed outputs each configured for coupling to one of the two or more loads. It can also comprise a power distribution switching assembly coupled to an input of the multiplexing unit and the two or more pulsed outputs, and configured to split pulses from a pulse train received at the input into distributed pulses at the two or more pulsed outputs. The pulsed power supply can be configured to provide the pulse train to the input of the multiplexing unit. The pulsed power supply can comprise a means for generating the pulse train and a memory configured to store target parameters for the two or more loads. The pulsed power supply can also comprise a processing portion and this processing portion can be configured to access the target parameters and predict a schedule of distributed pulses for the two or more loads. The processing portion can also be configured to identify one or more overlaps between pulses in different ones of the distributed pulses. The processing portion can further be configured to instruct the means for generating the pulse train to apply a phase shift to one or more pulses in the pulse train such that the overlaps do not occur when the power distribution switching assembly splits up the pulse train into the distributed pulses.

Yet further aspects of the disclosure can be characterized as a non-transitory, tangible computer readable storage medium, encoded with processor readable instructions to perform a method for driving two or more distinct loads using a single pulsed power supply and avoiding overlapping pulses to the two or more distinct loads. The method can comprise accessing target parameters for each of the two or more distinct loads and predicting instances of overlap between distributed pulses configured for provision to the two or more distinct loads if the target parameters are followed without variance. The distributed pulses can be formed from a single pulse train. The method can further include scheduling a first variance into a schedule of the distributed pulses to avoid the instances of overlap and instructing a power distribution switching assembly to distribute pulses in the pulse train to the two or more distinct loads according to the schedule.

Some embodiments of the disclosure can be characterized as a pulsed power supply driving two or more distinct loads. The pulsed power supply can include two or more pulsed outputs, a power distribution switching assembly, a processing portion, a memory, and a multiplexing module stored on the memory and executable on the processing portion. The memory can be coupled to the processing portion and can store a target pulse frequency and a target duty cycle for each of the two or more pulsed outputs and for a period of time (e.g., sine the target frequency and target duty cycle can change over time). The target pulse frequencies or target pulse duty cycles of at least two of the two or more pulsed outputs can be different during the period of time. The multiplexing module can be executable on the processing portion to, during the period of time, access the target pulse frequency and the target duty cycle in the memory for each of the two or more pulsed outputs. The multiplexing module can be executable on the processing portion to, during the period of time, access the target pulse frequency and the target duty cycle in the memory for each of the two or more pulsed outputs. The multiplexing module can be executable on the processing portion to, during the period of time, predict instances of overlap between pulses of the two or more pulsed outputs. The multiplexing module can be executable on the processing portion to, during the period of time, instruct the power distribution switching assembly to schedule the timing of the distributed pulses to avoid the overlap.

Other aspects of the disclosure can be characterized as a pulsed power supply assembly configured to couple to and drive two or more loads. The assembly can comprise a pulse power supply and a multiplexing unit. The pulsed power supply can provide a first pulse train at a first output. The multiplexing unit can comprise a first input, two or more pulsed outputs, a power distribution switching assembly, and a memory. The first input can be coupled to the first output. Each of the two or more pulsed outputs can be configured to provide a distributed pulse train to a corresponding one of the two or more loads. The power distribution switching assembly can be configured to distribute pulses from the first pulse train to the two or more pulsed outputs and to schedule a timing of the distributed pulses. The memory can store a target pulse frequency and a target duty cycle for each of the two or more loads during a time period. The target pulse frequencies for at least two of the two or more loads during the time period, are different. The processing portion can be coupled to the memory and can read processor executable instructions on the memory, that when executed, cause the processing portion to: access the target pulse frequency and the target duty cycle in the memory for each of the two or more pulsed outputs; predict instances of overlap between pulses of the two or more pulsed outputs; and instruct the power distribution switching assembly to schedule the timing of the distributed pulses to avoid the overlap.

Other aspects of the disclosure can be characterized as a multiplexing unit coupled to a pulsed power supply and driving two or more distinct loads. The pulsed power supply can provide a first pulse train. The multiplexing unit can comprise two or more pulsed outputs, a power distribution switching assembly, a processing portion, and a memory. The processing portion can control the power distribution switching assembly. The memory can be coupled to the processing portion and can store a target pulse frequency and target duty cycle for each of the two or more pulsed outputs for a time period. The pulse frequencies of at least two of the two or more pulsed outputs can be different during the time period. The multiplexing module can be stored on the memory and can be executable on the processing portion to, for a period of time: access the target pulse frequency and the target duty cycle in the memory for each of the two or more pulsed outputs; predict instances of overlap between pulses of the two or more pulsed outputs; and instruct the power distribution switching assembly to schedule the timing of pulses reaching the at least two pulsed outputs to avoid the overlap.

Other aspects of the disclosure can be characterized as a pulsed power supply assembly configured to couple to and drive two or more loads. The assembly can comprise a pulsed power supply having a multiplexing unit and providing a first pulse train to the multiplexing unit. The multiplexing unit can comprise two or more pulsed outputs, a power distribution switching assembly, and a memory. Each of the two or more pulsed outputs can be configured to provide a pulse train to a corresponding one of the two or more loads. The power distribution switching assembly can be configured to distribute pulses from the first pulse train to the two or more pulsed outputs and to schedule a timing of the distributed pulses. The memory can store a target pulse frequency and a target duty cycle for each of the two or more loads during a time period, wherein the target pulse frequencies for at least two of the two or more loads during the time period are different. The processing portion can be coupled to the memory and can read processor executable instructions on the memory, that when executed, cause the processing portion to: access the target pulse frequency and the target duty cycle in the memory for each of the two or more pulsed outputs; predict instances of overlap between pulses of the two or more pulsed outputs; and instruct the power distribution switching assembly to schedule the timing of the distributed pulses to avoid the overlap.

Other aspects of the disclosure can be characterized as a non-transitory, tangible computer readable storage medium, encoded with processor readable instructions to perform a method for driving two or more distinct loads using a single pulsed power supply and avoiding overlapping pulses to the two or more distinct loads. The method can comprise accessing a target pulse frequency for each of the two or more distinct loads. The method can also comprise accessing a target pulse duty cycle for each of the two or more distinct loads. The method can also comprise predicting instances of overlap between distributed pulses configured for provision to the two or more distinct loads if the target pulse frequencies and target pulse duty cycles are followed without variance, the distributed pulses being formed from a single pulse train. The method can also comprise instructing a power distribution switching assembly to schedule a first variance into a schedule of the distributed pulses to avoid the overlap. The method can also comprise monitoring a difference between the target frequency and an average frequency of each of the distributed pulses, and reducing these differences via application of additional variances to future distributed pulses.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
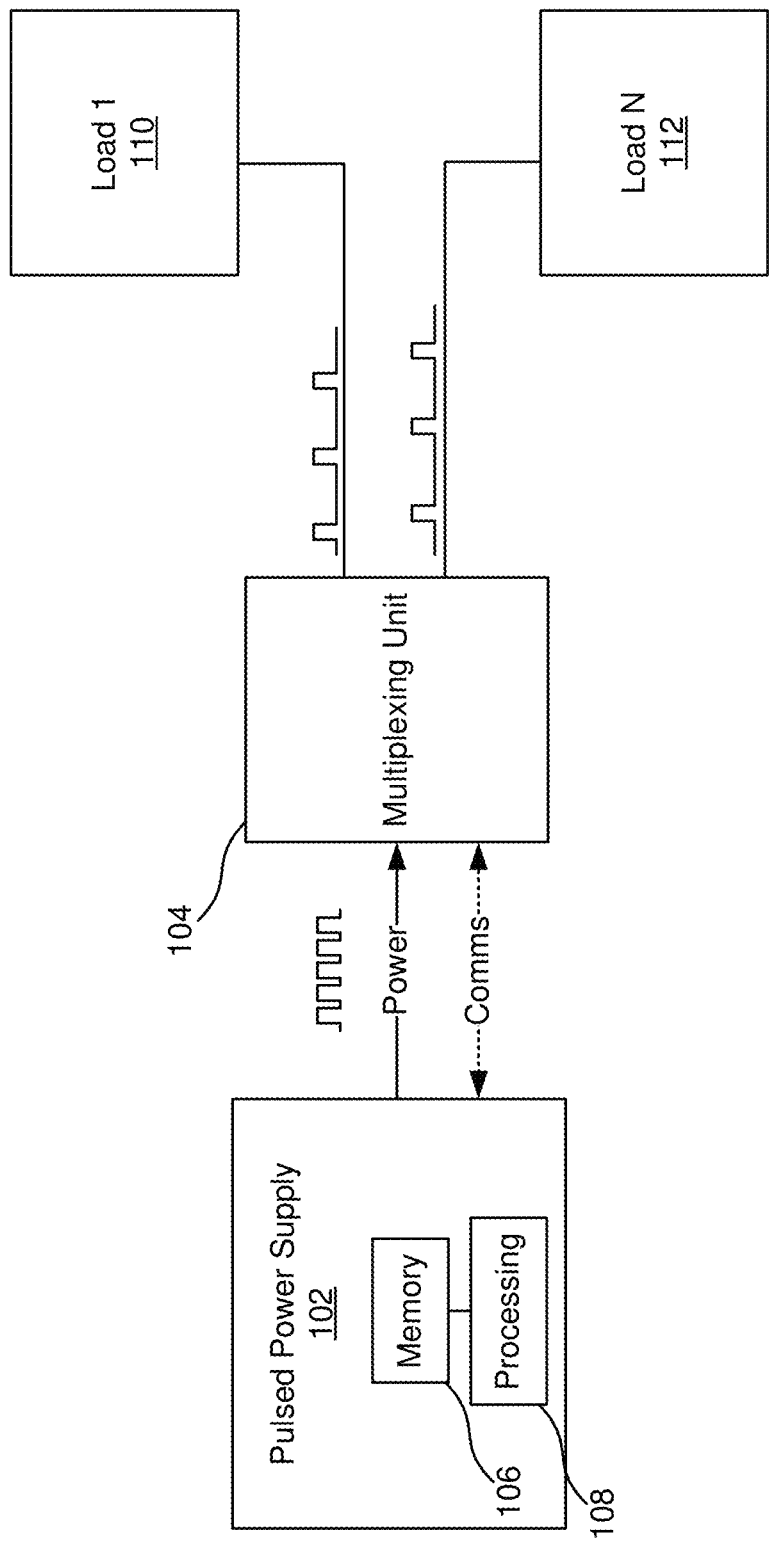
FIG. 1 illustrates an embodiment of a power delivery system for provisioning pulsed power to two or more loads using a single pulsed power supply.

The present disclosure relates generally to pulsed power supplies. In particular, but not by way of limitation, the present disclosure relates to systems, methods and apparatuses for driving multiple loads using a single pulsed generator.

To make more efficient use of pulsed power supplies used to power electrodes running different recipes in parallel, this disclosure describes a single pulsed power supply coupled to a multiplexing unit that distributes pulsed power from the single pulsed power supply to multiple loads that can each have distinct recipes or pulse frequency and phase requirements. In other words, the multiplexing unit can intake a rapid series of pulses from the single pulsed power supply and output multiple pulse trains (or distributed pulses) to multiple loads where the pulse trains can have different frequencies and/or duty cycles. In some embodiments, the multiplexing unit can be a component or sub-system within the single pulsed power supply. Each of the output pulse trains may have a lower frequency than the input frequency, and each of the output pulse trains may have different frequencies. Phase shifts can either be applied in the pulsed power supply or the multiplexing unit to avoid any overlap between pulses provided to different loads. In other words, since each input pulse can only be provided to one of the plurality of loads, some of the input pulses may be phase shifted in the pulsed power supply or multiplexing unit to avoid overlap between pulse trains to the plurality of loads. In an embodiment, this disclosure covers any variation of nD<100%, where n is the number of channels or loads being driven, and D is the average duty cycle of all pulse trains. In other words, as the number of channels increases, the average duty cycle per channel is reduced. Alternatively, higher duty cycles can be achieved where fewer channels are used.

In addition to improving power supply reliability, this disclosure allows smaller power supplies to be used. Traditionally, where multiple loads could be powered at the same time (i.e., where overlapping output pulses are allowed), the power supply is often sized to handle multiple simultaneous pulses. This disclosure, by removing the possibility of pulse overlaps, allows a power supply tailored to provide not much more than the power needed in a single pulse. Thus, smaller and less costly power supplies can be used with implementation of this disclosure. In some embodiments, loads can include one or more electrodes of a plasma processing chamber.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Figure 16:
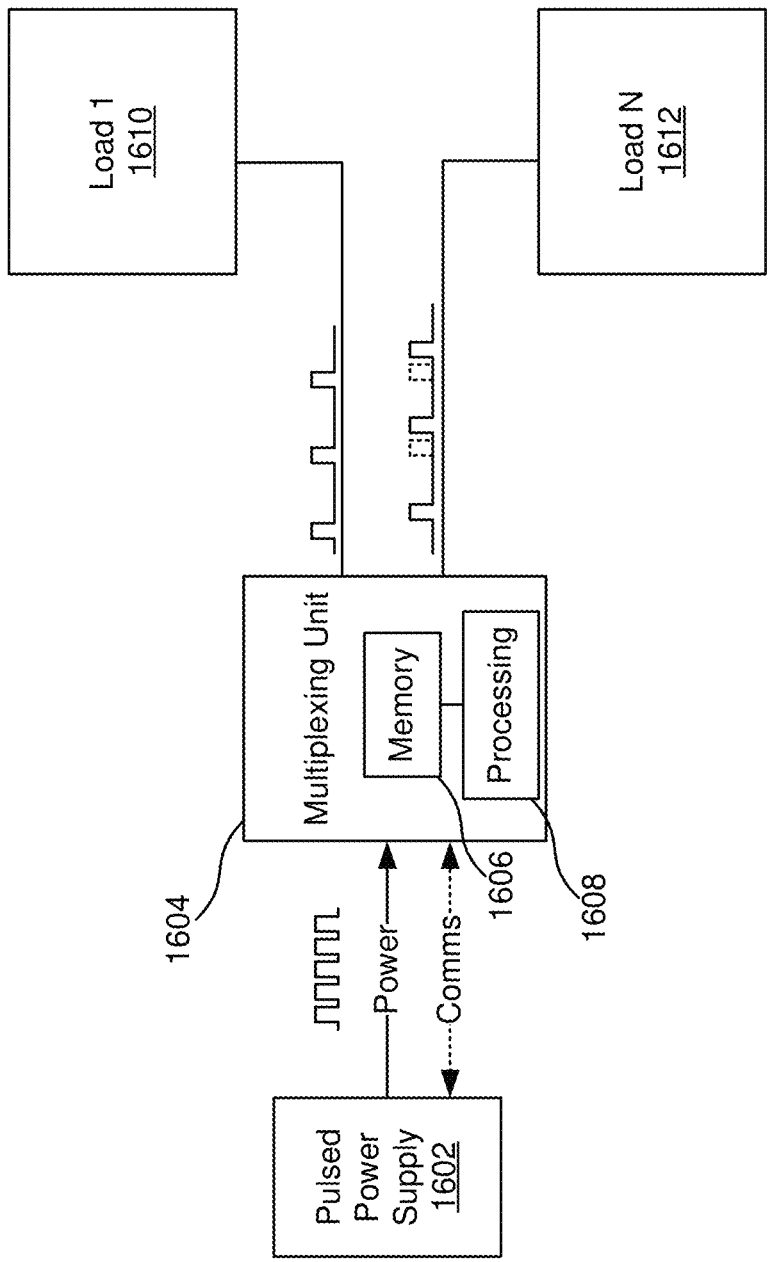
FIG. 16 illustrates an embodiment of a power delivery system for provisioning pulses of power to two or more loads using a single pulsed power supply.
Figure 17:
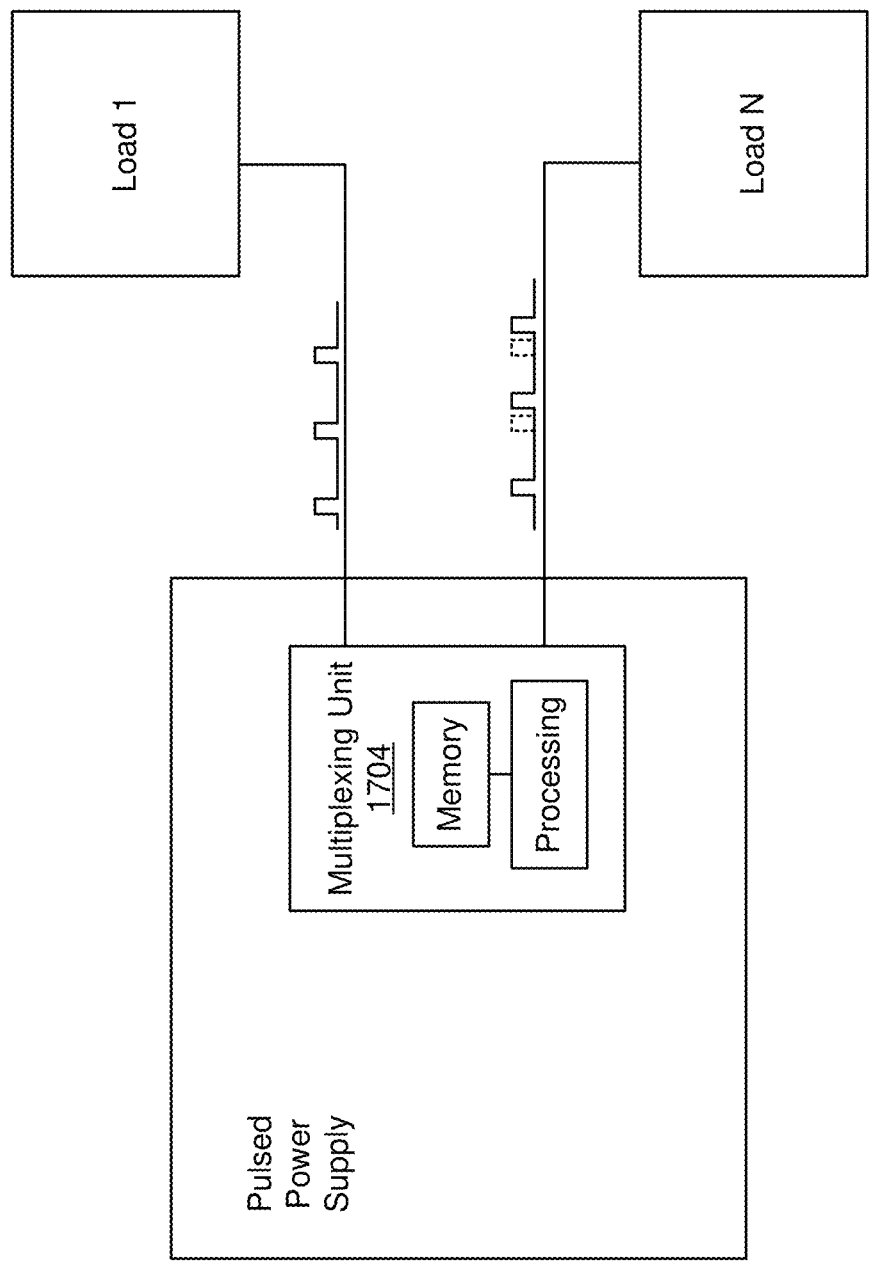
FIG. 17 illustrates an alternative embodiment to FIG. 16.
Figure 18:
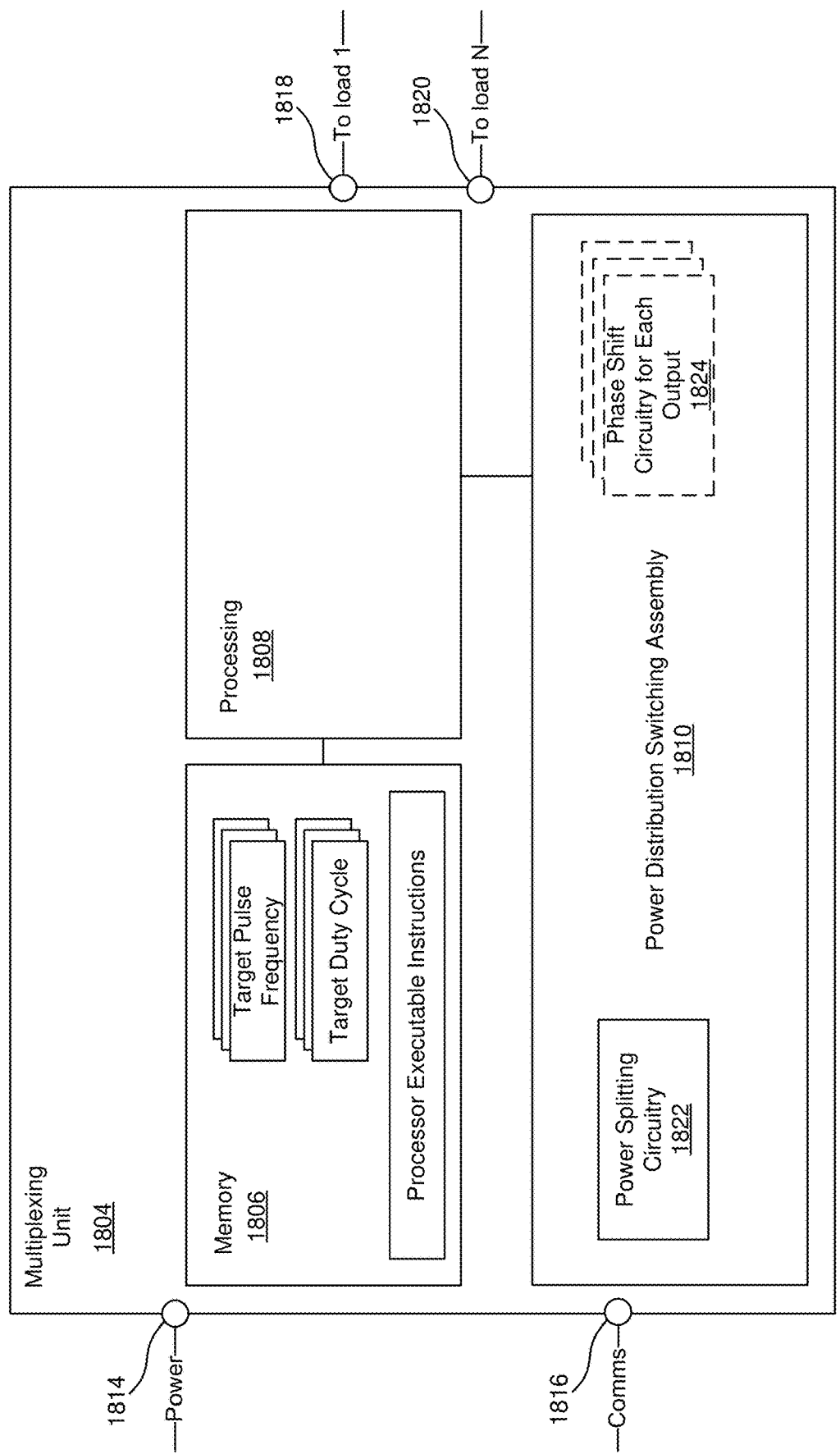
FIG. 18 illustrates a detailed embodiment of a multiplexing unit.

FIG. 1 illustrates an embodiment of a power delivery system for provisioning pulses of power to two or more loads using a single pulsed power supply. The pulsed power supply 102 can be coupled to a multiplexing unit 104 that converts a single pulse train from the pulsed power supply 102 into a plurality of pulse trains, called distributed pulse trains, each of which is provided to a separate pulsed output of the multiplexing unit 104, and each of these outputs is coupled to a distinct load. In the illustrated embodiment, loads 1 (110) through N (112) are shown, where N can be any number. The pulsed power supply 102 ensures that pulses to the loads do not overlap. This may involve scheduling a pulse train in the pulsed power supply 102, which could include application of phase shifts (e.g., phase delays), changes to frequency, and/or changes to duty cycle in the pulsed power supply 102. In some embodiments, and as shown in FIGS. 16-18, creating and/or adjusting a schedule of pulses can alternatively be performed in the multiplexing unit 104. Either way, the pulsed power supply provides pulsed power to the multiplexing unit 104, and the pulsed power supply 102 is also in communication with the multiplexing unit 104. A processing portion 108 in the pulsed power supply 102 can access target parameters for the 1 through N loads in a memory 106, and generate a schedule for the distributed pulses in the multiplexing unit 104. This analysis and schedule generation may be performed on a processing portion 108 executing processor executable code stored in a tangible processor executable medium such as the memory 106. Generation of the schedule can include predicting when distributed pulses for the loads 110, 112 should occur if the target parameters (e.g., frequency, duty cycle, conduction time) are followed. This predicted schedule can also show where overlaps between distributed pulses will occur and the processing portion 108 can make adjustments to the schedule to avoid these overlaps (e.g., applying phase delays to certain pulses). In the process, the processing portion 108 can also modify the schedule of distributed pulses (e.g., perform this phase shifting) with the goal of maintaining an average duty cycle and frequency of each of the pulse trains of distributed pulses as close to target parameters (e.g., a processing recipe) as is possible (some variation from target parameters is often acceptable, but the amount of acceptable variance depends on the recipe). Certain ones of the pulse trains may be given priority in this regard, such that if the processing portion 108 has to choose between phase shifting a first pulse train versus a second pulse train, and the second pulse train has priority, then the processing portion 108 may choose to phase shift one or more pulses from the first pulse train.

Figure 2:
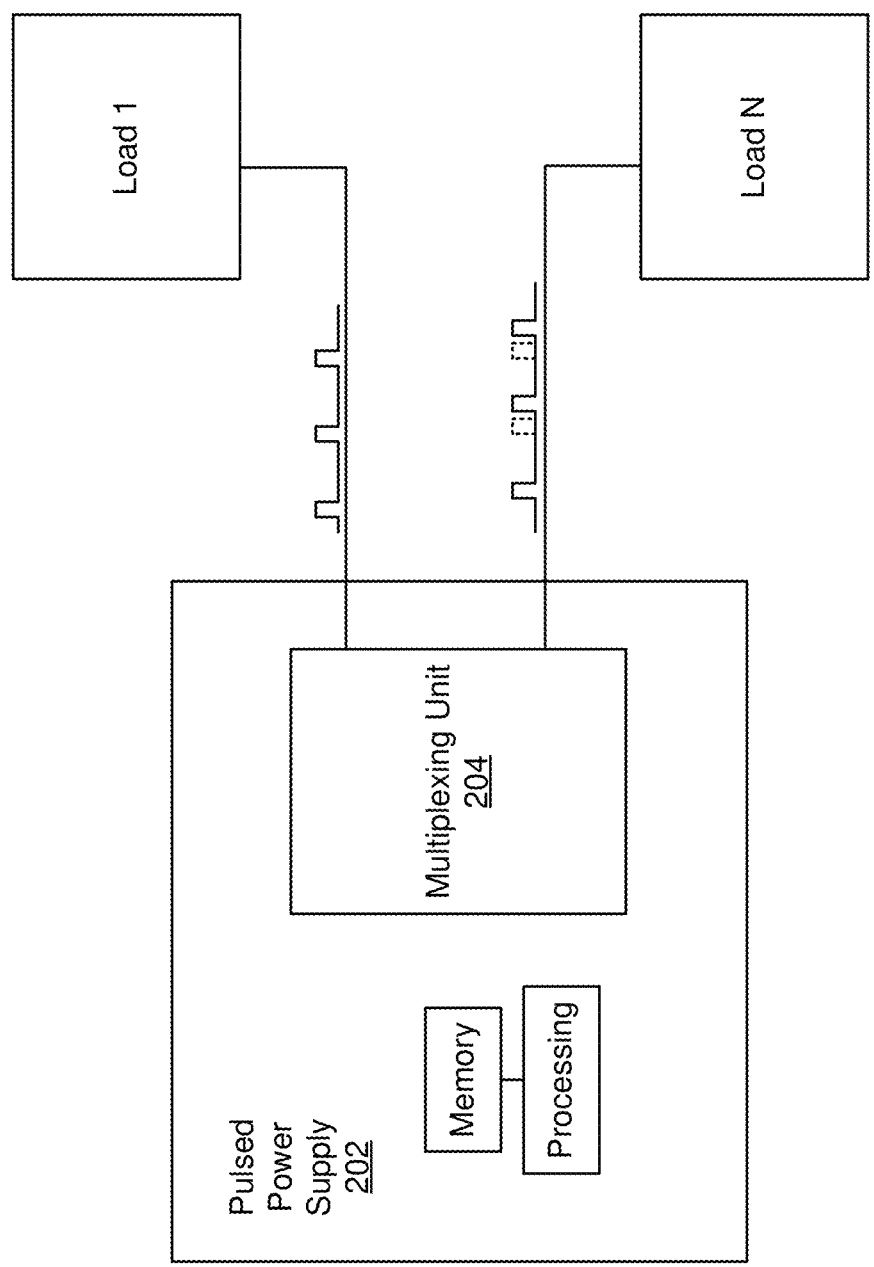
FIG. 2 illustrates an alternative embodiment to FIG. 1.

Although the multiplexing unit 104 is shown as a distinct component or system from the single pulsed power supply 102, in other embodiments, the multiplexing unit 104 can be a sub-component or sub-system of the single pulsed power supply 102. For instance, FIG. 2 illustrates one such embodiment. In such an embodiment, the multiplexing unit 204 can be part of the pulsed power supply's generation of pulse trains and can operate to distribute the pulses to ones of the multiple loads (e.g., loads 1 through N). FIG. 2 shows just one alternative embodiment of a multiplexing unit and its arrangement in or relative to the pulsed power supply—many other non-limiting examples are also possible.

Figure 3:
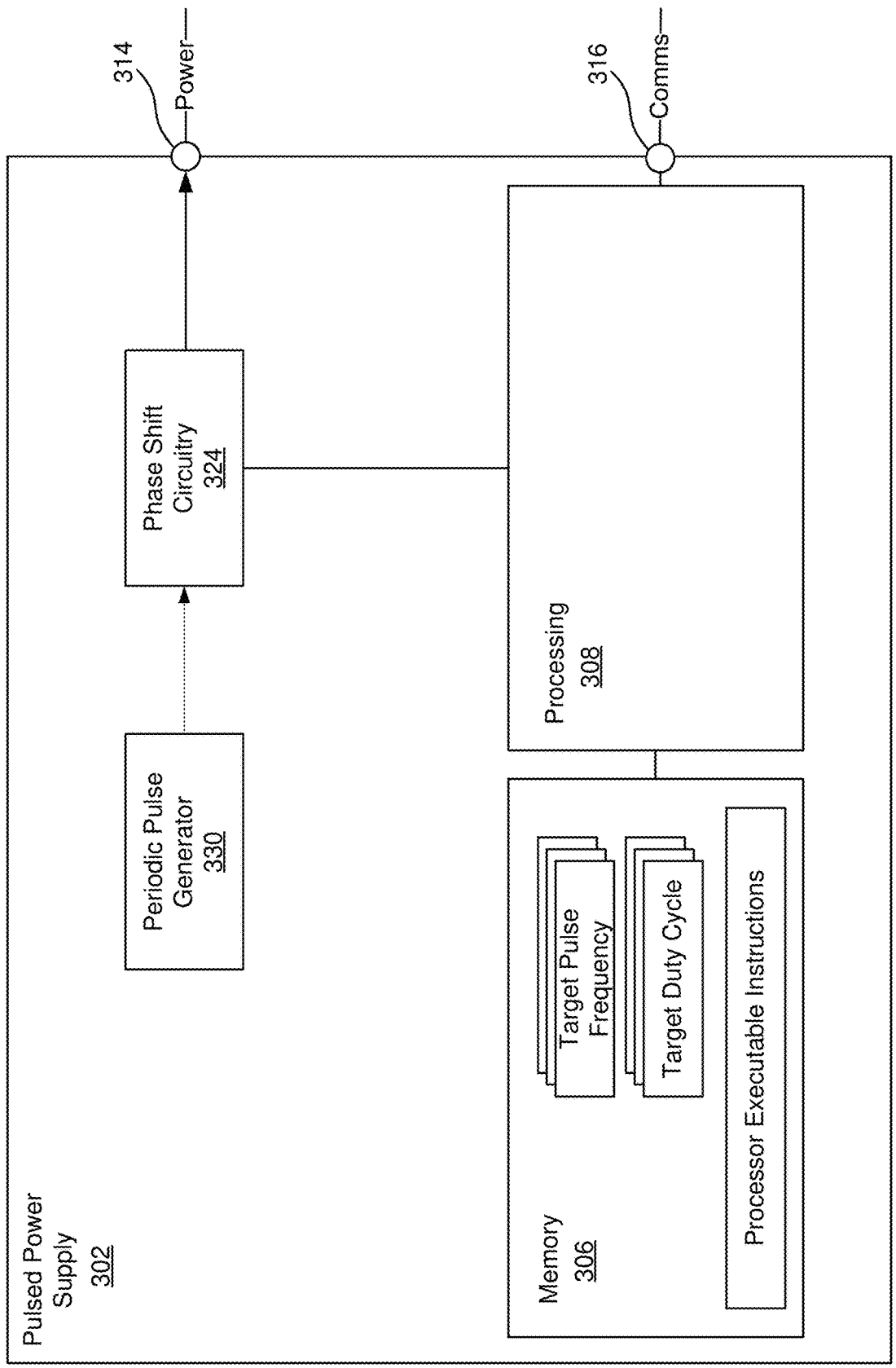
FIG. 3 illustrates a detailed embodiment of a pulsed power supply.

FIG. 3 illustrates a detailed embodiment of a pulsed power supply 302 (e.g., 102 in FIG. 1). In some embodiments, a single pulsed power supply can provide a pulse train to the pulsed output 314, which is configured for coupling to a multiplexing unit 104, and the multiplexing unit 104 can distribute the pulse train to multiple pulsed outputs. The pulse train can have one or more phase shifts or other scheduling changes applied to it to achieve distributed pulse trains to loads 1 through N that meet target parameters for each load while avoiding overlaps between the distributed pulses. For instance, it may be desirable to apply a first frequency of pulses to Load 1, while applying a second frequency of pulses to Load N. A memory 306 can store target parameters for each load (e.g., recipe information) such as pulse frequency, duty cycle, and conduction time for the various loads. The pulse frequency and duty cycle for each load may be associated with a time period, $t_1$, while a different pulse frequency and duty cycle may be stored for a second time period, $t_2$. In other words, as recipes change over time, these target parameters can change. These are referred to as "target" parameters, rather than hard and fast requirements, and can be associated with an acceptable variance, such that phase delays can be applied to the pulse trains for each load within the limits of the acceptable variance. This disclosure is particularly useful when there is a frequency difference between pulses within the time period, $t_1$, since such differences in frequency can lead to overlapping pulses in a multiplexed system if adjustments are not made.

The memory 306 may also include processor executable instructions, that when executed on the processing portion 308, cause the processing portion 308 to control phase shift circuitry 324 to schedule the pulse train at the output 314. Further, the processing portion 308 may control the phase shift circuitry 324 to phase shift one or more pulses in the pulsed power supply's 302 pulse train to ensure no overlaps between the outgoing pulse train. More specifically, the processing portion 308 can instruct the phase shift circuitry 324 to generate a scheduled pulse train that the multiplexing unit 104 can split into multiple distributed pulse trains without any overlaps between the distributed pulse trains.

In an embodiment, the phase shift circuitry 324 can receive a periodic pulse train from a periodic pulse generator 330 of the pulsed power supply 302 and apply phase shifts to create the pulse train provided to the output 314. In this embodiment, the periodic pulse generator 330 may comprise any number of different topologies configured to produce a periodic pulsed output. For instance, the periodic pulse generator 330 may comprise a DC voltage supply coupled to one or more pairs of half or full-bridge switching circuits configured to convert the DC voltage into a pulsed output.

However, other switching power supplies can also be implemented to carry out the periodic pulse generator 330. In another embodiment, the phase shift circuitry 324 and the periodic pulse generator 330 can be a unified circuit (not shown), for instance, where a DC voltage supply provides a DC voltage to one or more switching converters whose switching is controlled by a phase controller receiving instructions/indications from the processing portion 308. The phase controller can control a timing of switching within the one or more switching converters such that an output comprises a pulse train including pulses that are phase shifted from a periodic pulse train in order to meet the schedule needed to feed the multiplexing unit 104 and avoid pulse overlaps between distributed pulse trains.

Figure 5:
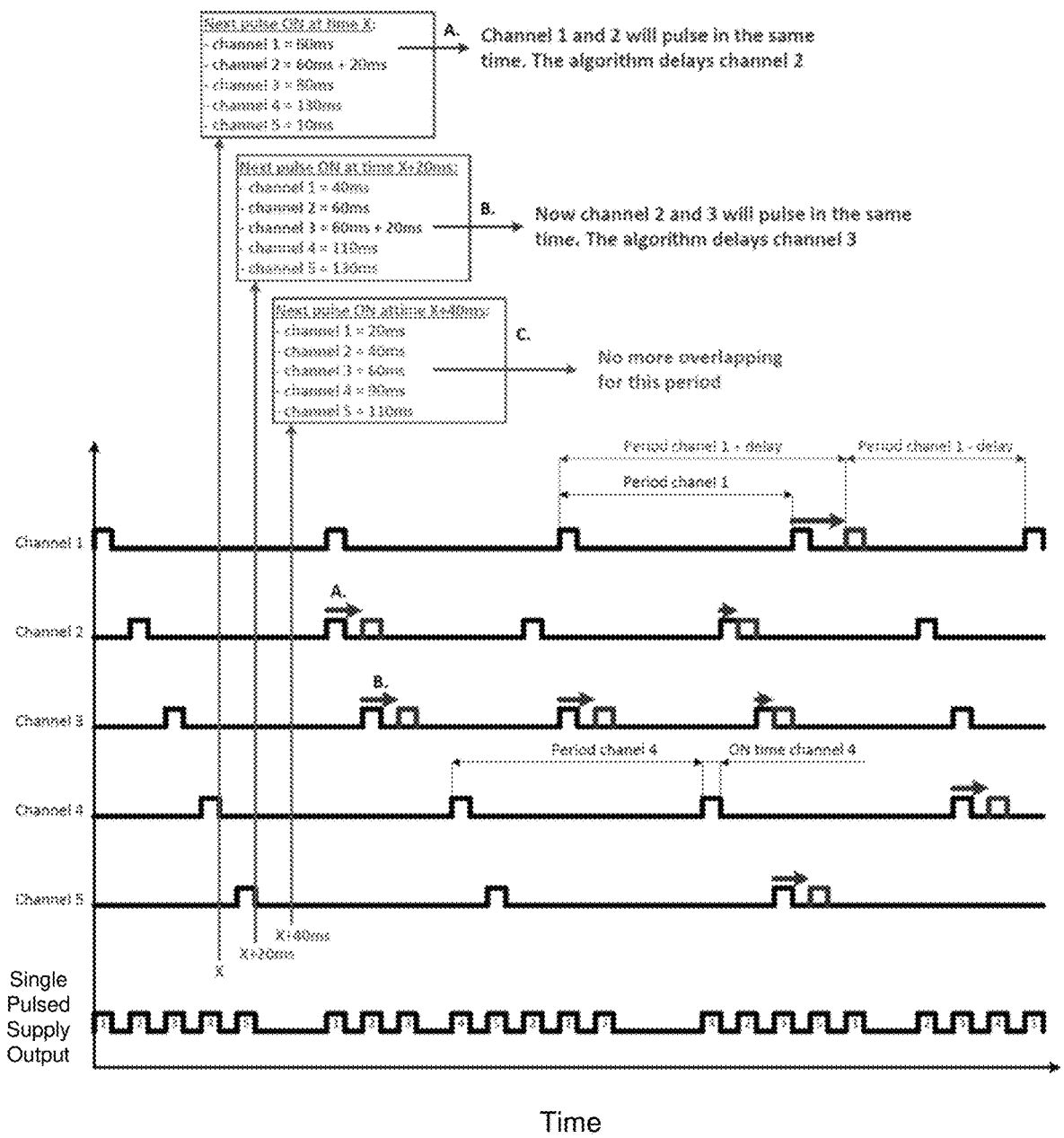
FIG. 5 illustrates a timing chart demonstrating exemplary timing that may result from a system such as that shown in FIGS. 1-4, but with N=5.

In any of these topologies, the plot for the single pulsed supply output at the bottom of FIG. 5 shows one exemplary, but non-limiting, pulse train that includes phase delays to avoid overlaps in the distributed pulse trains (see Channels 1-5) that the multiplexing unit 104 splits out from the single input pulse train and provides to the loads 1 to N.

At the same time, the processing portion 308 tailors phase shifts to maintain an average duty cycle, frequency, or conduction time for the distributed pulses in the multiplexing unit 104 that align with target parameters' (e.g., a recipe's) called for frequency, duty cycle, or conduction time. Said another way, the processing portion 308 selects the phase shifts to maintain a recipe or etch within stated parameters of variance. This may include altering future pulses in opposing relation to a first variance to achieve a target average duty cycle, frequency, conduction time, or to stay within recipe variances (or a variance threshold). For instance, if a channel's pulse is delayed to avoid an overlap at time $t_1$, then the same channel may have a subsequent pulse hastened at a future time $t_2$ where an overlap is not an issue, to bring the average conduction in line with a target. Thus, the processing portion 308 seeks to generate a pulse train at output 314 that, when multiplexed by the multiplexing unit 104, avoids pulses in different distributed pulse trains from overlapping, while also achieving desired average frequency and duty cycle for each channel over a "long" period of time, such as 1 second.

Additionally, certain ones of the distributed pulse trains may be given priority in this regard, such that if the processing portion 308 has to choose between phase shifting a first pulse train versus a second pulse train, and the second pulse train has priority, then the processing portion 308 may choose to phase shift one or more pulses from the first pulse train.

Figure 6:
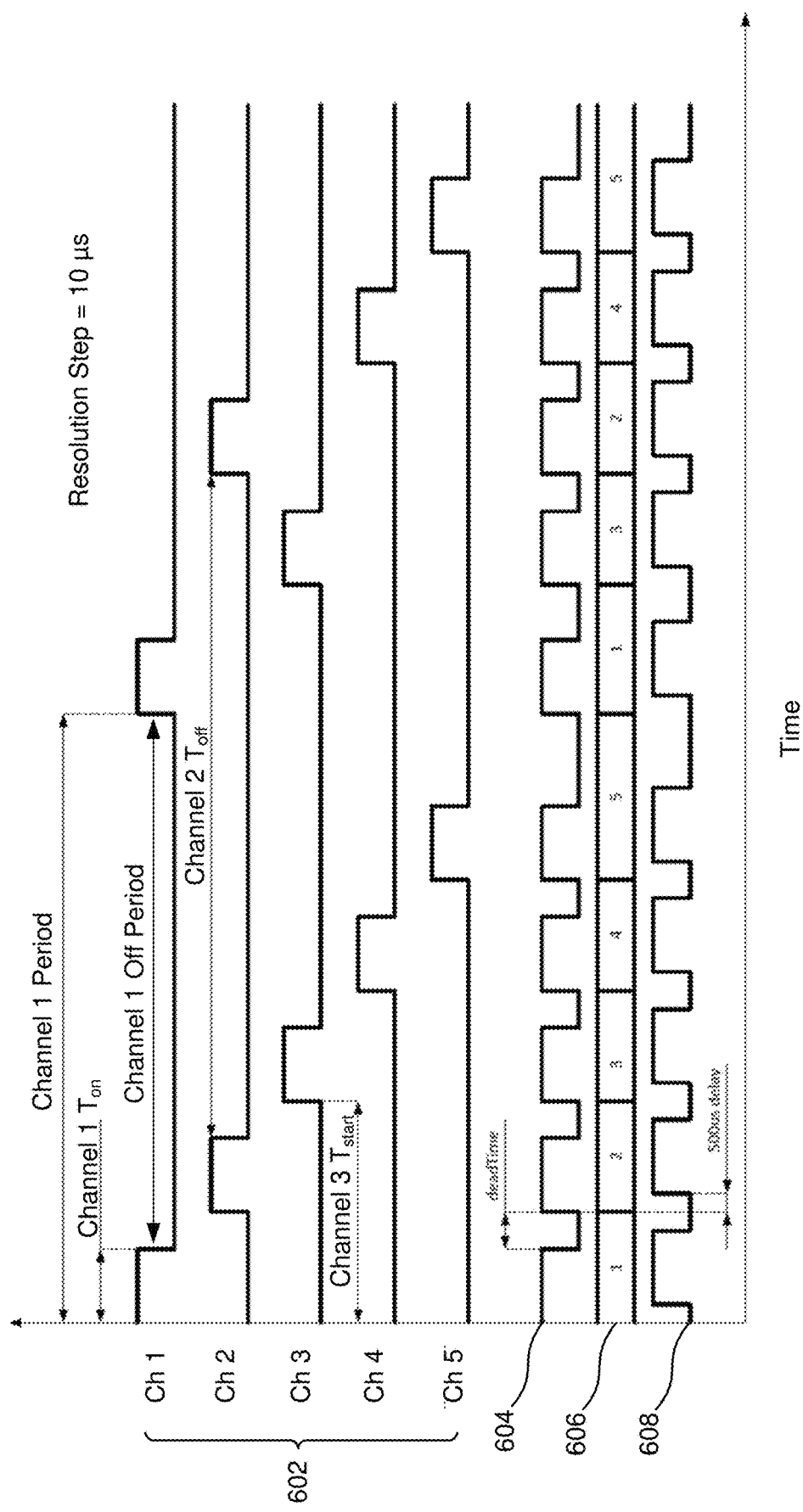
FIG. 6 illustrates another embodiment of a timing chart for an N=5 system.

After the processing portion 308 generates a schedule for the pulse train at the output 314 and a schedule for the distributed pulses in the multiplexing unit 104, it passes some or all of this information via the communication link to the multiplexing unit 104 via the communications output 316. The multiplexing unit 104 can use this information to control distribution of the pulses to the 1 through N loads. In particular, the processing portion 308 can pass a schedule of the distributed pulses to the multiplexing unit 104 so that the multiplexing unit 104 knows to which channel (or load) to distribute each pulse in the pulse train from the pulsed power supply 302. In an embodiment, the processing portion 308 can send a channel indication to the communications output 316 in time with pulses at the power output 314. For instance, FIG. 6 shows a timing chart for five channels of the multiplexing unit 104 (602) as well as a timing chart for the single pulse train 604 from the pulsed power supply 302 and a channel indicator 606 corresponding to each of the pulses 604. The multiplexing unit 104 can receive this channel indicator 606 from the pulsed power supply 302 and direct its outputs to the corresponding channels. In this way, the multiplexing unit 104 operates much like a "slave" device to the pulsed power supply 102.

Figure 4:
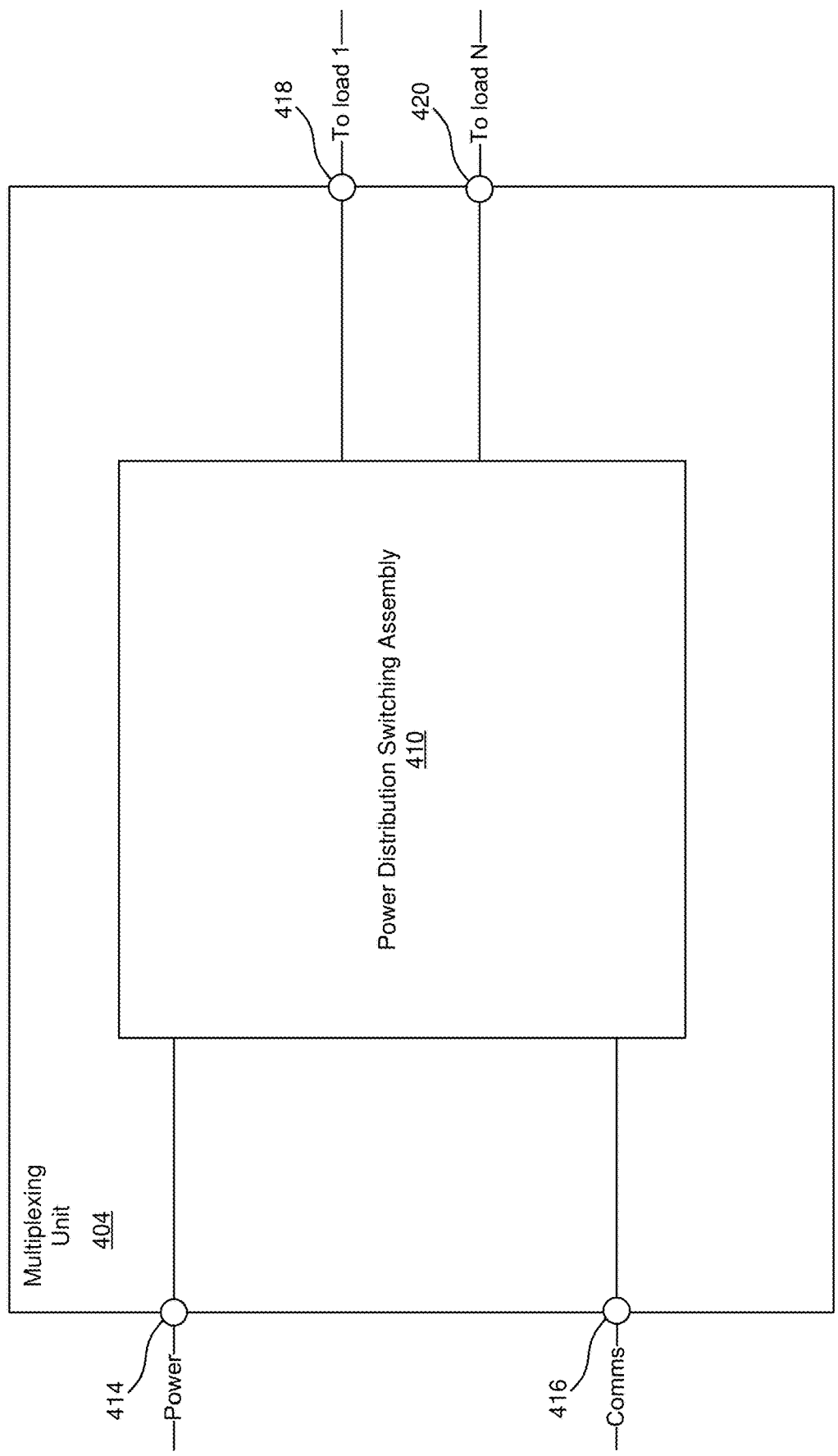
FIG. 4 illustrates a detailed embodiment of a multiplexing unit.

FIG. 4 illustrates a multiplexing unit 404 according to one embodiment of this disclosure. The illustrated multiplexing unit 404 can include a power distribution switching assembly coupled to a communications input 416 and a power input 414. The power distribution switching assembly 410 can also be coupled to a plurality of outputs 418, 420, one for each of 1 through N loads. The pulse train from the pulsed power supply 102 can arrive via the power input 414, and communications telling the power distribution switching assembly 410 where to send each pulse in the pulse train arrives via the communications input 416. For instance, a channel indicator can arrive at the communications input 416 at the same time, or slightly before, a pulse in the pulse train arrives at the power input 414. The communications, possibly including a channel indicator, can allow or instruct the power distribution switching assembly 410 to direct each pulse in the pulse train to a corresponding one of the pulsed outputs 418, 420. The power distribution switching assembly 410 can split up the pulse train into multiple distributed pulse trains and provide these distributed pulse trains to the pulsed outputs 418, 420. The pulsed outputs 418, 420 are configured for coupling to 1 through N loads. Although later embodiments will discuss how the power distribution switching assembly 410 can apply phase shifts to the pulse train, in this embodiment, the power distribution switching assembly 410 is merely responsible for distributing pulses to the different outputs 418, 420, whereas timing of pulsed is handled by the pulsed power supply 102.

Various topologies could be implemented to carry out the power distribution switching assembly 410. For instance, a single input coupled to the power input 414 could be coupled to one through N outputs via a switch for each output. A switch driver can control which one of the switches is open at any one time to control distribution or multiplexing of the incoming pulse train to the various outputs 418, 420.

Returning to FIG. 3, the memory 306 of the pulsed power supply 302 may include a minimum off period, possibly for each channel. The minimum off period can be used to ensure that all channels can be turned on before any one channel starts its next cycle. The minimum off period for a channel can depend on the number of channels, the on time period of each channel, and deadtime. For instance, assuming a five-channel system, and with reference to FIG. 6, the minimum off period for Channel 1 would be the sum of the ON times of the other channels 2-5 plus five times the deadtime.

FIG. 5 illustrates an exemplary timing chart that could be associated with the embodiment of FIGS. 1-4 where N=5. Each of channels 1 to 5 provide a distributed pulse train to a distinct one of the five loads. The pulsed power supply can access recipe requirements and acceptable variances therefrom for each load from memory and can thus predict a timing of pulses on each channel and thereby predict overlaps between channels. For instance, the pulsed power supply can recognize that Channels 2 and 3 have a higher frequency than Channel 1, which leads to a predicted pulse overlap at the second pulse between Channels 1 and 2 and a predicted pulse overlap at the third pulse between Channels 1 and 3. The pulsed power supply can phase shift Channels 2 and 3 to avoid these overlaps. However, when Channel 2 is shifted, a new predicted overlap appears between Channels 2 and 3. As a result, the pulsed power supply can phase shift Channel 3 to avoid this overlap. The illustration shows how this phase shifting can continue throughout the recipes and for each of the various channels. For instance, the fourth pulse period of Channel 1 sees a phase shift to avoid overlap with a phase-shifted Channel 5. Once the pulsed power supply determines a schedule for the channels that does not involve pulse overlap between distributed pulses, the pulsed power supply can instruct the multiplexing unit to follow this schedule (e.g., by passing channel indicators in time with every pulse of the pulse train) and generate a pulse train that supports this schedule. In other words, instead of sending a periodic pulse train, the pulsed power supply can apply phase shifts or other variances to pulses in its pulse train such that a pulse train is passed to the multiplexing unit that already has the timing of the pulses to be multiplexed built into the pulse train. For instance, the bottom plot of FIG. 5 shows a resulting pulse train that the pulsed power supply could generate and provide to the multiplexing unit after determining the pulse schedule for the five channels seen above the single pulse train.

FIG. 6 illustrates another exemplary timing chart that could be associated with the embodiments of FIGS. 1-4 where N=5, and to show possible configuration parameters for the processing portion 308. While this disclosure has discussed frequency, duty cycle, and conduction time as possible target parameters, in other embodiments, channel on and off times as well as channel start times can be target parameters and in some cases can achieve the same result as specifying frequency, duty cycle, and/or conduction time. Notably, each channel can be assigned a target period, channel on time, a channel off time, and a channel start time.

In an embodiment, the multiplexing unit can switch channels some period of time before the arrival of each corresponding pulse from the pulsed power supply. In an embodiment, the pulsed power supply can send a channel indicator before it sends a corresponding pulse (e.g., with the pulse 500 μs delayed from the channel indicator). For instance, plot 606 can show the channel indicators from the pulsed power supply and plot 608 can show the pulse train's arrival, which is 500 μs delayed from the pulse train 604 were the channel indicator and pulse train to be perfectly aligned. This delay helps to ensure that each pulse arrives roughly in a middle of a channel selection indicator as shown by plot 606. The delay can be calculated as a half a deadtime period.

FIGS. 7-11 illustrate aspects of a timing chart showing phase delays applied to a five-channel system. In the illustrated embodiment, an algorithm for predicting pulse overlaps and applying phase adjustments to avoid overlaps (in either the pulsed power supply or the multiplexing unit), starts by looking for overlaps in a schedule of distributed pulses where scheduling is based on the target parameters. In this example, the configuration is: ON time=1 ms for all channels; channel 1 OFF time=57 ms; channel 2 OFF time=52 ms; channel 3 OFF time=48 ms; channel 4 OFF time=42 ms; channel 5 OFF time=36 ms. It should be noted that, while this illustration uses target off times, other target parameters can also be used, such as frequency, duty cycle, and conduction time, to name a few non-limiting examples. Given these target parameters, the processing portion can periodically assess overlaps (e.g., every 10 μs). If an overlap is predicted in the schedule, then the processing portion can instruct that a delay be applied to one or more channels. Avoiding delays may involve applying multiple delays to multiple channels and in some cases coming back to a previously-delayed channel and applying an additional one or more delays. In other words, the process of varying the schedule can be iterative until all overlaps have been removed from the schedule.

Figure 7:
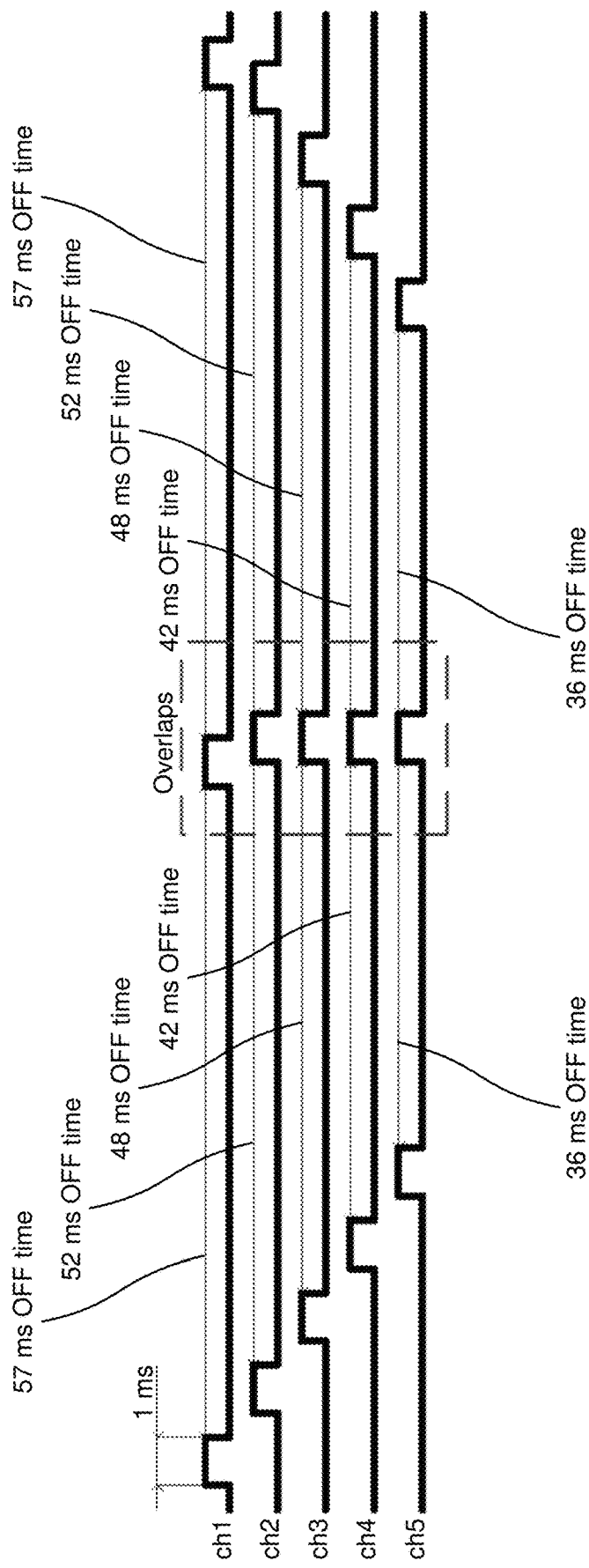
FIG. 7 illustrates an example scheduling for a five-channel system leading to overlaps in all five channels at the second pulse cycle.
Figure 8:
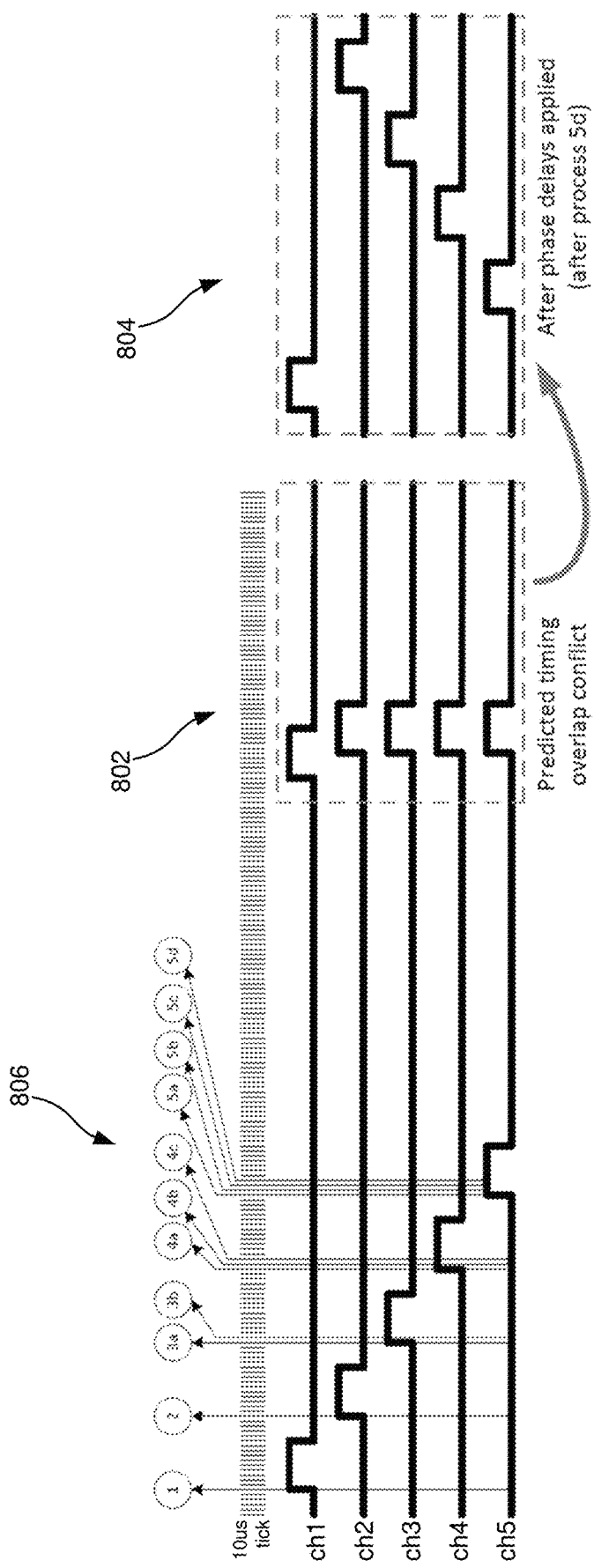
FIG. 8 illustrates a solution or new schedule for the second cycle of pulses shown in FIG. 7.

FIG. 8 illustrates an overview of the steps that the processing portion may take to remove the overlaps seen in FIG. 7. The outcome 804 of applying variances to the schedule of the second cycle of pulses results in a timing chart 804 without overlaps. In other words, after variances (e.g., phase delays) are applied, the timing of the distributed pulses may appear at the far right 804. The points in time 1 through 5d (806) are each associated with phase delays that the processing portion applies as seen in FIGS. 9-12.

Figure 9:
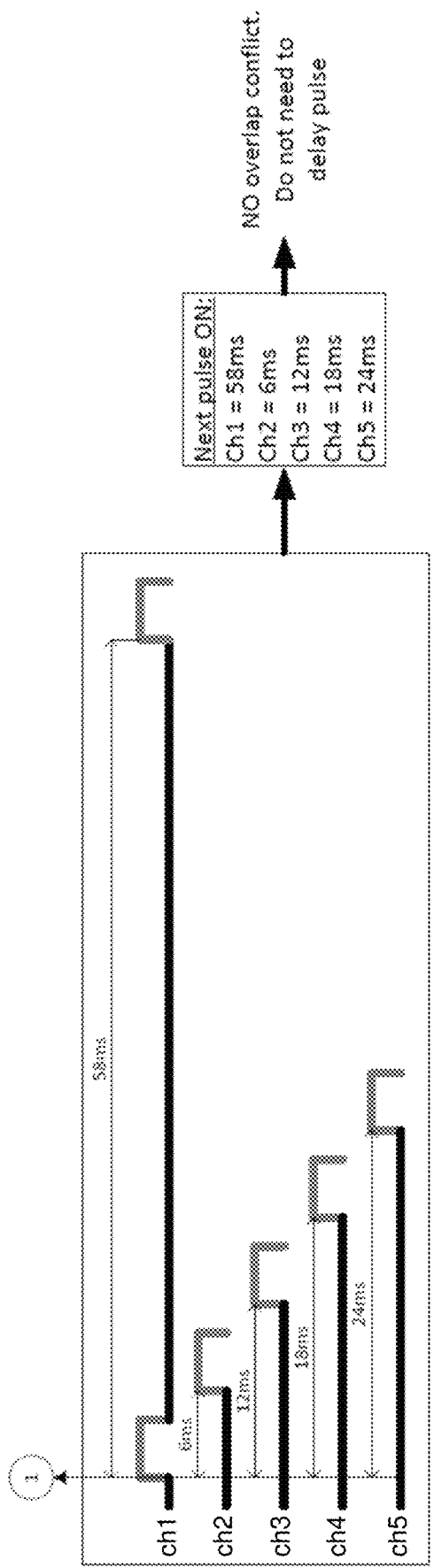
FIG. 9 illustrates a timing chart to help show how analysis of the first cycle of pulses occurs.

FIG. 9 illustrates analysis of the first cycle of pulses, where it can be seen that no overlap is predicted and thus no variances need to be applied.

Figure 10:
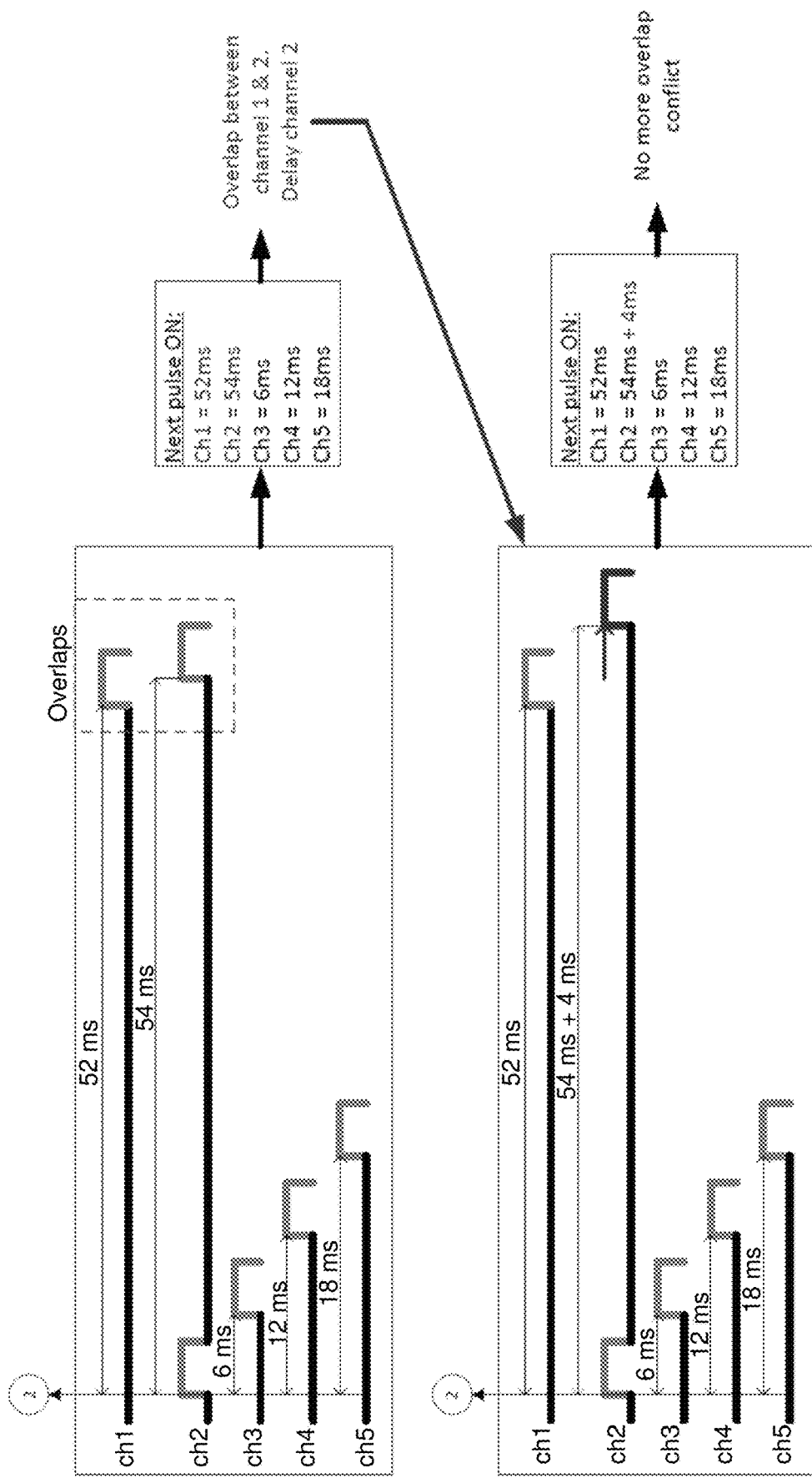
FIG. 10 illustrates a set of steps for removing overlaps between the first channel and the second channel.

FIG. 10 illustrates analysis of the second cycle of pulses, where an overlap between channels 1 and 2 is identified. In response, the processing portion delays channel 2 by 4 ms.

Figure 11:
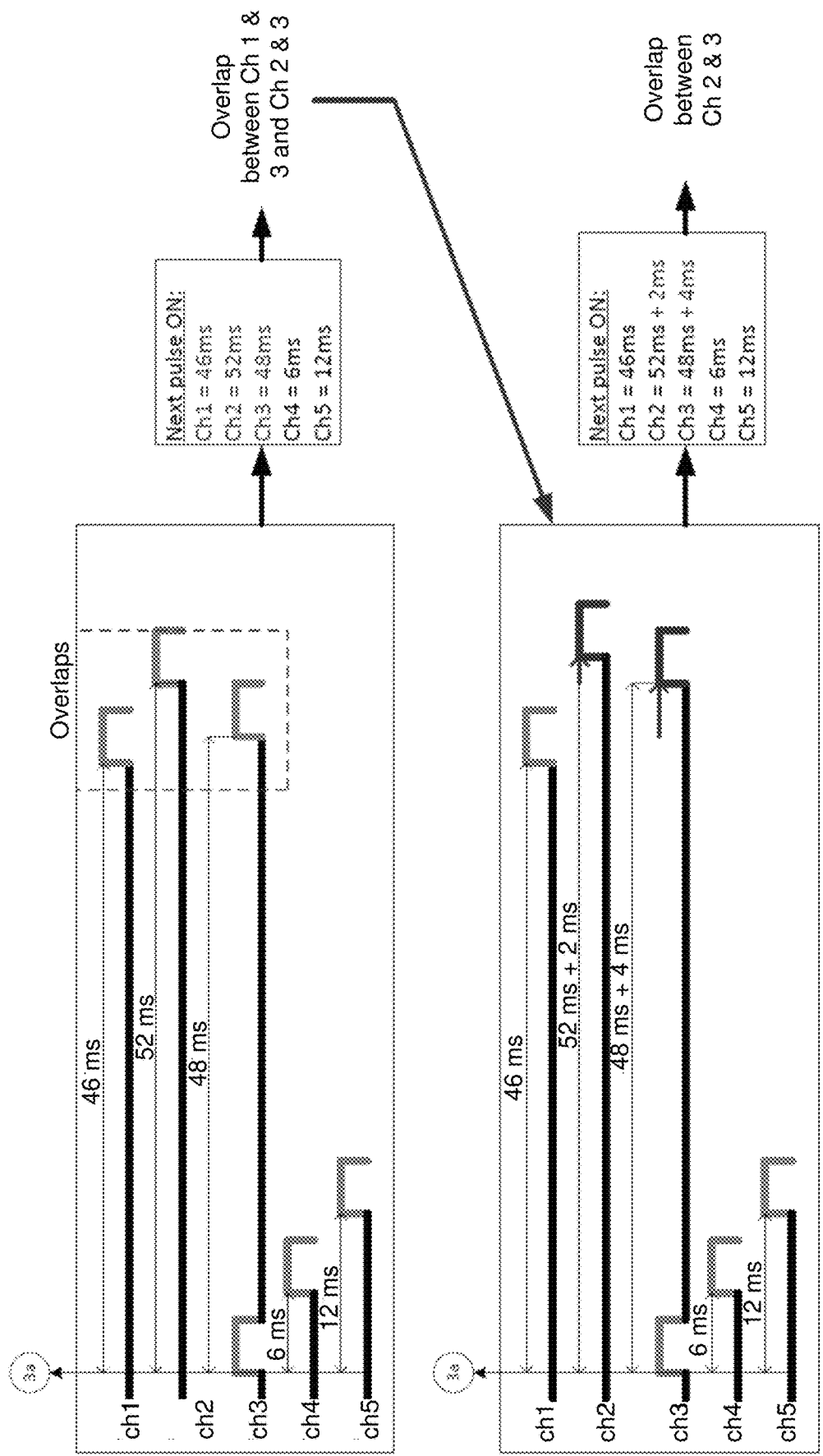
FIG. 11 illustrates a set of steps for removing overlaps between the first channel and the second and third channels.

FIG. 11 illustrates identification of additional overlaps in the second cycle of pulses and application of variances to remove these overlaps. Here, the processing portion identifies an overlap between channels 1 and 3 and between channels 2 and 3. Delays of 2 ms and 4 ms are then applied to channels 2 and 3, respectively. But this still leaves an overlap between channels 2 and 3.

Figure 12:
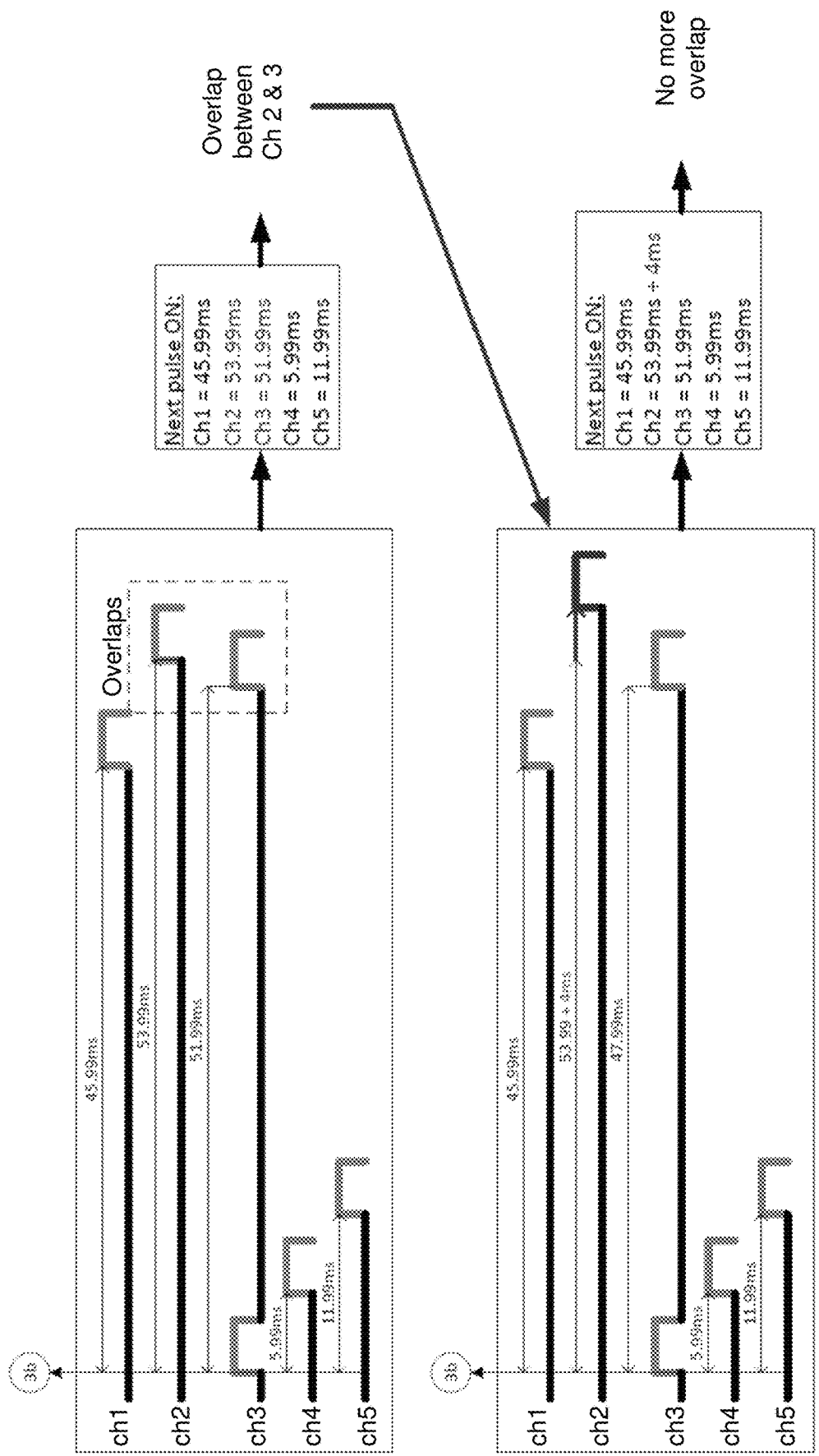
FIG. 12 illustrates a set of steps for removing overlaps between the second channel and the third channel.

FIG. 12 illustrates identification of additional overlaps in the second cycle of pulses and application of variances to remove these overlaps. Here, the processing portion identifies the overlap between channels 2 and 3 and applies a delay of 4 ms to channel 2, such that there are no more overlaps between any of the five channels.

This scheduled set of distributed pulses for the second cycle of pulses can then be carried out by the pulsed power supply and the new channel order and timing can be passed to the multiplexing unit to control pulse train distribution upon arrival at the multiplexing unit.

Figure 13:
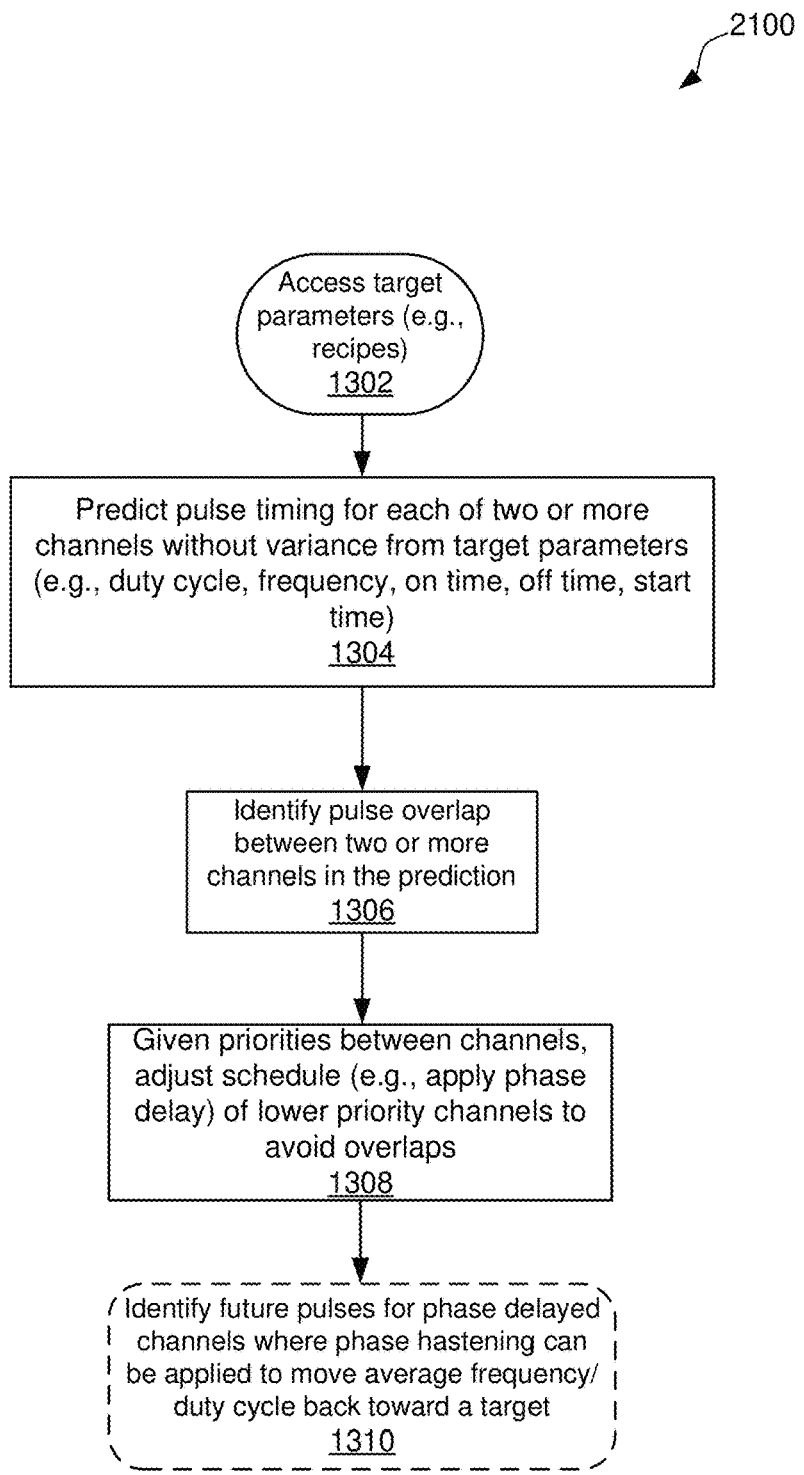
FIG. 13 illustrates a method for driving two or more distinct loads using a single pulsed power supply and avoiding overlapping pulses to the two or more distinct loads.

FIG. 13 illustrates a method of distributing two or more pulse trains to respective loads where a power supply for that distribution is a single pulsed power supply. The method 1300 includes accessing recipes (or other target parameters) for two or more loads (Block 1302). These recipes may include duty cycle, frequency, and/or conduction time for one or more time periods of a recipe associated with a load such as a plasma processing load. For instance, the duty cycle of pulsed power delivered to a plasma processing chamber may change as the recipe progresses in order to achieve different thin film deposition or etching properties. Different pulse duty cycles and/or frequencies could also achieve different etching characteristics, such as sidewall profile or aspect ratio for through-wafer vias, to name just two examples. Different chambers may use different recipes or recipes may start at different times, such that pulse overlaps would occur were each load provided power independently. The recipes may also include acceptable variances for parameters such as the pulse frequency, pulse duty cycle, and conduction. Although this method 1300 and most of this disclosure describes "recipes" that call for different pulse parameters for each of two or more loads, applications other than plasm processing may also benefit from this disclosure's ability to provide different sequences of powered pulses to multiple loads while avoiding pulse overlaps.

The method 1300 can predict the timing for each pulse for the two or more channels (e.g., output channels of a pulsed power supply with multiplexing functionality or output channels of a multiplexing unit separate from the pulsed power supply) (Block 1304). For instance, the first two cycles of pulses shown in FIG. 8 could be predicted pulse timings for a five-channel system, where one sees that there are predicted overlaps in the second of the two pulse cycles. The pulsed power supply or multiplexing unit can phase shift these future pulses in order to avoid the overlaps (see phase shifted schedule of second cycle 804). In other words, the pulsed power supply or multiplexing unit can set a new schedule for the future pulses and implement this schedule via internal phase shifts or adjustments to other parameters such as frequency and duty cycle, to name two non-limiting examples. The method 1300 can identify pulse overlaps between two or more channels in the prediction (Block 1306), and given optional priorities between the two or more channels, can apply phase delays to lower priority channels to avoid the predicted overlaps (Block 1308). When a phase delay is applied it is typically only applied to a single cycle and the period for subsequent cycles remains the same, such that a next period after the delay is shorter than the average and thus helps to move the average back toward a target parameter. However, optionally, the method 1300 identifies future pulses for channels that are to see phase delays, where additional phase delays or "phase hastening" (the opposite of a phase delay) can be applied to pull an average duty cycle and/or average frequency back toward a target value (Block 1310). For instance, if a phase delay of 4 ms is applied to a first channel in a first time period, and the method 1300 identifies a later pulse for the first channel were a 4 ms phase hastening can be applied without creating an overlap in pulses, then the 4 ms phase hastening can be applied to the first channel to bring the average for the first channel back in line with a target.

The method 1300 can be applied to an embodiment where the processing portion and schedule generation are in the pulsed power supply (e.g., FIGS. 1-4) as well as an embodiment where the processing portion and schedule generation are in the multiplexing unit (e.g., FIGS. 16-18).

Figure 14:
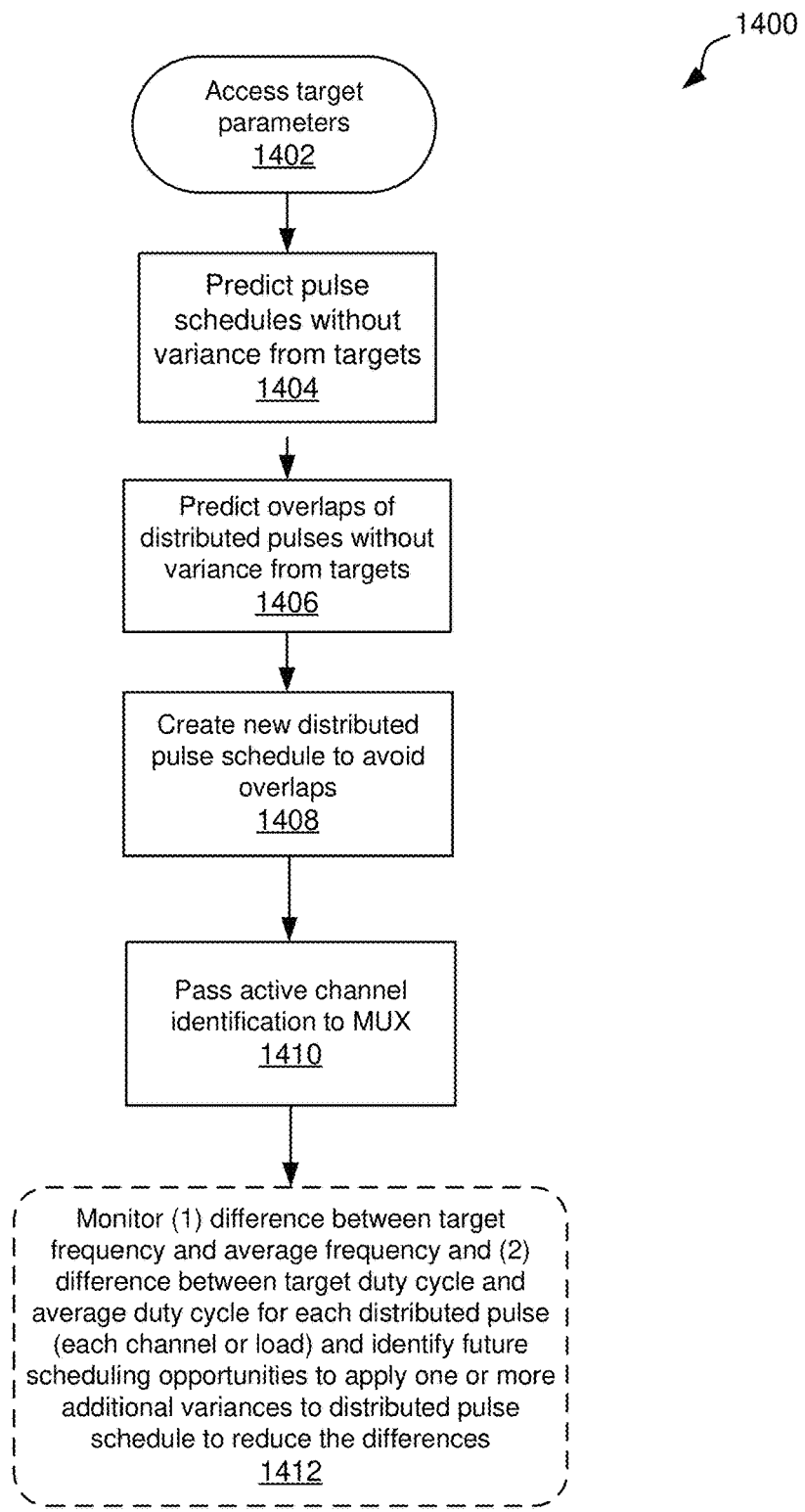
FIG. 14 illustrates another method for driving two or more distinct loads using a single pulsed power supply and avoiding overlapping pulses to the two or more distinct loads.

FIG. 14 illustrates a method for driving two or more distinct loads using a single pulsed power supply and avoiding overlapping pulses to the two or more distinct loads. The method 1400 can include accessing target parameters (e.g., frequency, duty cycle, conduction time, etc.) for each of the two or more distinct loads (Block 1402). This may involve turning to a memory of a pulsed power supply (e.g., memory 106 or 306 in FIG. 1 or 3) and accessing stored parameters for each of a plurality of loads, including at least a target pulse frequency and/or a target pulse duty cycle, where the target pulse frequency and the target pulse duty cycle may be scheduled to change over time. An acceptable variance for these target parameters may also be accessed in the memory. The method 1400 may further include predicting instances of overlap between distributed pulses that are configured for provision to the two or more distinct loads if the target parameters are followed without variance (Block 1404). That is, a pulsed power supply can look at the target parameters for each load and predict when pulses for each load will occur if the target parameters are precisely followed (Block 1406). If one or more distributed pulses for different loads overlap in time (i.e., are scheduled to occur at least partially at the same time), then the method 1400 can instruct phase shift circuitry (e.g., 324) in a pulsed power supply to alter a schedule of pulses in a pulse train to avoid the overlap(s) (Block 1408). This may involve application of phase shifts or changes to frequency and/or duty cycle.

Once the new schedule has been set and variances have been applied to achieve the schedule, the method 1400 can pass channel identifications to the multiplexing unit telling it what channels to pass each pulse in the pulse train to (Block 1410). Additionally, the method 1400 can look to future opportunities to apply opposing variances or phase shifts to move an average frequency and/or target pulse duty cycle back toward the target pulse frequency and/or target pulse duty cycle for each channel (Block 1412). In particular, the method 1400 can monitor (1) differences between the target frequency and an average frequency of each distributed pulse train and (2) differences between the target duty cycle and an average duty cycle of each distributed pulse train. With these differences in hand, the method 1400 can look for future scheduling opportunities to apply one or more additional variances to the distributed pulse schedule to reduce those differences (Block 1412). For instance, if a first channel has seen a phase delay to avoid a first overlap with a second channel, then a future pulse for that channel could be hastened or phase shifted forward in time to move the average frequency back toward the target frequency. These future variances can be applied at the pulsed power supply. The method 1400 can then repeat for additional pulse overlaps.

Figure 15:
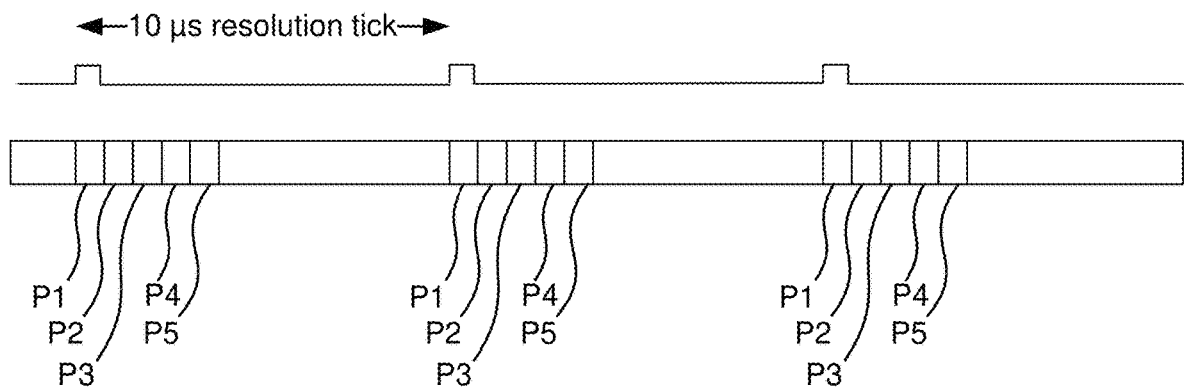
FIG. 15 illustrates a timing diagram helping to show how the processing portion of the pulsed power supply checks for overlaps in distributed pulses for a five-channel exemplary system.

FIG. 15 illustrates a timing diagram helping to show how the processing portion of the pulsed power supply checks for overlaps in distributed pulses for a five-channel exemplary system. The cycles shown in FIG. 15 correspond to pulse cycles. During phases 1 through 5 (P1 through P5) the processing portion can sequentially check for any overlaps with specific channels. For instance, P1 looks at overlaps with channel 1, P2 looks at overlaps with channel 2, and so on. When each analysis occurs, delay may also be based on priorities that are configured. For instance, when comparing two channels, a channel may only be delayed if an overlap exists and the channel to be delayed is scheduled to send a pulse after the other channel.

FIG. 16 illustrates an embodiment of a power delivery system for provisioning pulses of power to two or more loads using a single pulsed power supply. The pulsed power supply 1602 can be coupled to a multiplexing unit 1604 converts a single pulse train from the pulsed power supply 1602 into a plurality of pulse trains, called distributed pulse trains, each of which is provided to a separate pulsed output of the multiplexing unit 1604, and each of these outputs is coupled to a distinct load. In the illustrated embodiment, loads 1 (1610) through N (1612) are shown, where N can be any number. The multiplexing unit 1604 ensures that pulses to the loads do not overlap. This may involve the multiplexing unit performing phase shifting on pulses, or may involve the multiplexing unit instructing the pulsed power supply 1602 to change the frequency and/or duty cycle of certain of its pulses or to phase shift its pulses. Either way, the pulsed power supply provides pulsed power to the multiplexing unit 1604, and the pulsed power supply 1602 is also in communication with the multiplexing unit 1604. The pulsed power supply 1602 can indicate pulse frequency and duty cycle to the multiplexing unit, which can then provide this information to a processing portion 1608 that predicts output pulse trains for the loads 1610, 1612 based on recipes (e.g., duty cycle and frequency) for each of the loads that are stored in memory 1606. Where the processing portion 1608 predicts an overlap in pulses between the different pulse trains, the multiplexing unit 1604 can phase shift one or more pulses from one or more pulse trains to avoid the overlap. The processing portion 1608 can perform this phase shifting with the goal of maintaining an average duty cycle and frequency of each of the pulse trains as close to target parameters (e.g., a processing recipe as is possible (some variation from target parameters is often acceptable, but the amount of acceptable variance depends on the recipe). Certain ones of the pulse trains may be given priority in this regard, such that if the processing portion 1608 has to choose between phase shifting a first pulse train versus a second pulse train, and the second pulse train has priority, then the processing portion 1608 may choose to phase shift one or more pulses from the first pulse train.

Although the multiplexing unit 1604 is shown as a distinct component or system from the single pulsed power supply 1602, in other embodiments, the multiplexing unit 1604 can be a sub-component or sub-system of the single pulsed power supply 1602. For instance, FIG. 17 illustrates one such embodiment. In such an embodiment, the multiplexing unit 1704 can be part of the pulsed power supply's generation of a pulse train and can operate to distribute the pulses to ones of the multiple loads (e.g., loads 1 through N). For instance, the multiplexing unit 1704 can instruct switching circuitry of the pulsed power supply to generate a single pulse train that aligns with a desired single pulse train that already includes phase adjustments such that the multiplexing unit 1704 merely needs to distribute the pulses to different loads without any further phase changes. FIG. 17 shows just one alternative embodiment of a multiplexing unit and its arrangement in or relative to the pulsed power supply—many other non-limiting examples are also possible.

FIG. 18 illustrates a detailed embodiment of a multiplexing unit (e.g., 1604 in FIG. 16 or 1704 in FIG. 17). In some embodiments, a single pulsed power supply (e.g., 1602 in FIG. 16) can provide a periodic pulse train to the multiplexing unit 1804, at power input 1814, and the multiplexing unit 1804 can distribute the power signal to multiple pulsed outputs 1818, 1820 with one or more different phase shifts applied thereto to achieve desired pulse trains to various loads. For instance, it may be desirable to apply a first frequency of pulses to Load 1, while applying a second frequency of pulses to Load N. One or more of these frequencies can be higher or lower than a frequency of pulses received at the power input 1814. In particular, a memory 1806 can store recipe information such as pulse frequency and duty cycle for the various loads. The pulse frequency and duty cycle for each load may be associated with a time period, $t_1$, while a different pulse frequency and duty cycle may be stored for a second time period, $t_2$. In other words, as recipes change over time, these parameters can change. These can be target parameters, rather than hard and fast requirements, and can be associated with an acceptable variance, such that phase delays can be applied to the pulse trains for each load within the limits of the acceptable variance. This disclosure is particularly useful when there is a frequency difference between pulses within the time period, $t_1$, since such differences in frequency can lead to overlapping pulses in a multiplexed system if adjustments are not made.

The memory 1806 may also include processor executable instructions, that when executed on the processing portion 1808, cause the processing portion 1808 to control a power distribution switching assembly 1810 to distribute the single pulse train at the power input 1814 into multiple pulsed outputs 1818, 1820 (or distributed pulses). Further, the processing portion 1808 may control the power distribution switching assembly 1810 to phase shift one or more pulses from one or more of the distributed pulse trains to ensure no overlaps between the outgoing pulse trains. More specifically, power splitting circuitry 1822 can split the input pulse train from the power input 1814 into two or more distributed pulse trains at the pulsed outputs 1818, 1820. Phase shift circuitry 1824 for each of the N outputs can delay or speed up (i.e., phase shift) the distributed pulses to avoid overlaps between pulse trains (this can be seen as either a temporary change in duty cycle or frequency).

At the same time, the processing portion 1808 tailors phase shifts to maintain an average duty cycle, frequency, or conduction time for each of the pulsed outputs 1818, 1820 that aligns with a target parameters' (e.g., recipe's) called for frequency, duty cycle, or conduction time. Said another way, the processing portion 1808 selects the phase shifts to maintain a recipe or etch within stated parameters of variance. This may include altering future pulses in opposing relation to a first variance to achieve a target average duty cycle, frequency, conduction time, or to stay within recipe variances. For instance, if a channel's pulse is delayed to avoid an overlap at time $t_1$, then the same channel may have a subsequent pulse hastened at a future time $t_2$ where an overlap is not an issue, to bring the average conduction in line with a target. Thus, the processing portion 1808 seeks to generate a pulse train at output 1818 that avoids overlapping pulses while also achieving desired average frequency and duty cycle for each channel over a "long" period of time, such as 1 second. In some embodiments, the processing portion 1808 may instruct the pulsed power supply to alter its pulse train to support the schedule, in which case, the phase shift circuitry 1824 may not be needed.

Additionally, certain ones of the distributed pulse trains may be given priority in this regard, such that if the processing portion 1808 has to choose between phase shifting a first pulse train versus a second pulse train, and the second pulse train has priority, then the processing portion 1808 may choose to phase shift one or more pulses from the first pulse train.

In other embodiments, the processing portion 1808 can determine a frequency, phase, and duty cycle of the input pulse train at 1814 by communicating with the single pulsed power supply via the communication input-output (I/O) 1816, or measuring the pulse train. The processing portion 1808 can instruct the power supply to make modifications to the phase, duty cycle, and frequency of its output to help support a schedule set by the multiplexing unit 1804. Alternatively, the processing portion 1808 can instruct the power distribution switching assembly 1810 without causing adjustments to the pulsed power supply.

The memory 1806 may include a minimum off period, possibly for each channel. The minimum off period can be used to ensure that all channels can be turned on before any one channel starts its next cycle. The minimum off period for a channel can depend on the number of channels, the on time period of each channel, and deadtime. For instance, assuming a five-channel system, and with reference to FIG. 6., the minimum off period for Channel 1 would be the sum of the ON times of the other channels 2-5 plus five times the deadtime In FIGS. 16 and 18, it will be appreciated that the communications between the pulsed power supplies and the multiplexing units are not always necessary. For instance, where the processing portion 1608 determines phase, frequency, and/or duty cycle at the input 1614 and only controls phase shifts within the power distribution switching assembly 1610, communication with the pulsed power supply 1602 may not be used.

Referring back to FIG. 5, the illustrated timing chart could be associated with the embodiment of FIG. 16 where N=5. Each of channels 1 to 5 provide pulsed power to a distinct one of the five loads. The multiplexing unit can access recipe requirements and acceptable variances therefrom for each load from memory and can thus predict a timing of pulses on each channel and thereby predict overlaps between channels. For instance, the multiplexing unit can recognize that Channels 2 and 3 have a higher frequency than Channel 1, which leads to a predicted pulse overlap at the second pulse between Channels 1 and 2 and a predicted pulse overlap at the third pulse between Channels 1 and 3. The multiplexing unit can phase shift Channels 2 and 3 to avoid these overlaps. However, when Channel 2 is shifted, a new predicted overlap appears between Channels 2 and 3. As a result, the multiplexing unit can phase shift Channel 3 to avoid this overlap. The illustration shows how this phase shifting can continue throughout the recipes and for each of the various channels. For instance, the fourth pulse period of Channel 1 sees a phase shift to avoid overlap with a phase-shifted Channel 5. Once the multiplexing unit determines a schedule for the channels that does not involve pulse overlap between distributed pulses, the multiplexing unit can apply phase shifts to the pulse train from the pulsed power supply to follow this schedule or instruct the pulsed power supply to apply variances to the single pulse train to generate a pulse train that supports the schedule. For instance, the bottom plot of FIG. 5 shows a resulting pulse train that the pulsed power supply could generate and provide to the multiplexing unit.

In an embodiment, a forward-looking desired pulse pattern at input 1814 can be communicated back to the single pulsed power supply through the communication I/O 1816, and the single pulsed power supply can modify its pulse pattern to produce the pulse pattern seen at the bottom of the chart—this being the ideal input pulse pattern to be multiplexed into the distributed pulse patterns seen for Channels 1-5. Said another way, the single pulsed power supply can use this information (or instruction from the multiplexing unit) to generate a pulse train that supports a pulse schedule determined by the multiplexing unit.

As discussed earlier, the multiplexing unit can switch channels some period of time before respective pulses from the pulsed power supply arrive, as shown in FIG. 6. This can be implemented even where the multiplexing unit includes the processing portion rather than the pulsed power supply.

FIGS. 8-12 can also apply to the embodiments of FIGS. 16-18, where the processing portion is in the multiplexing unit.

Figure 19:
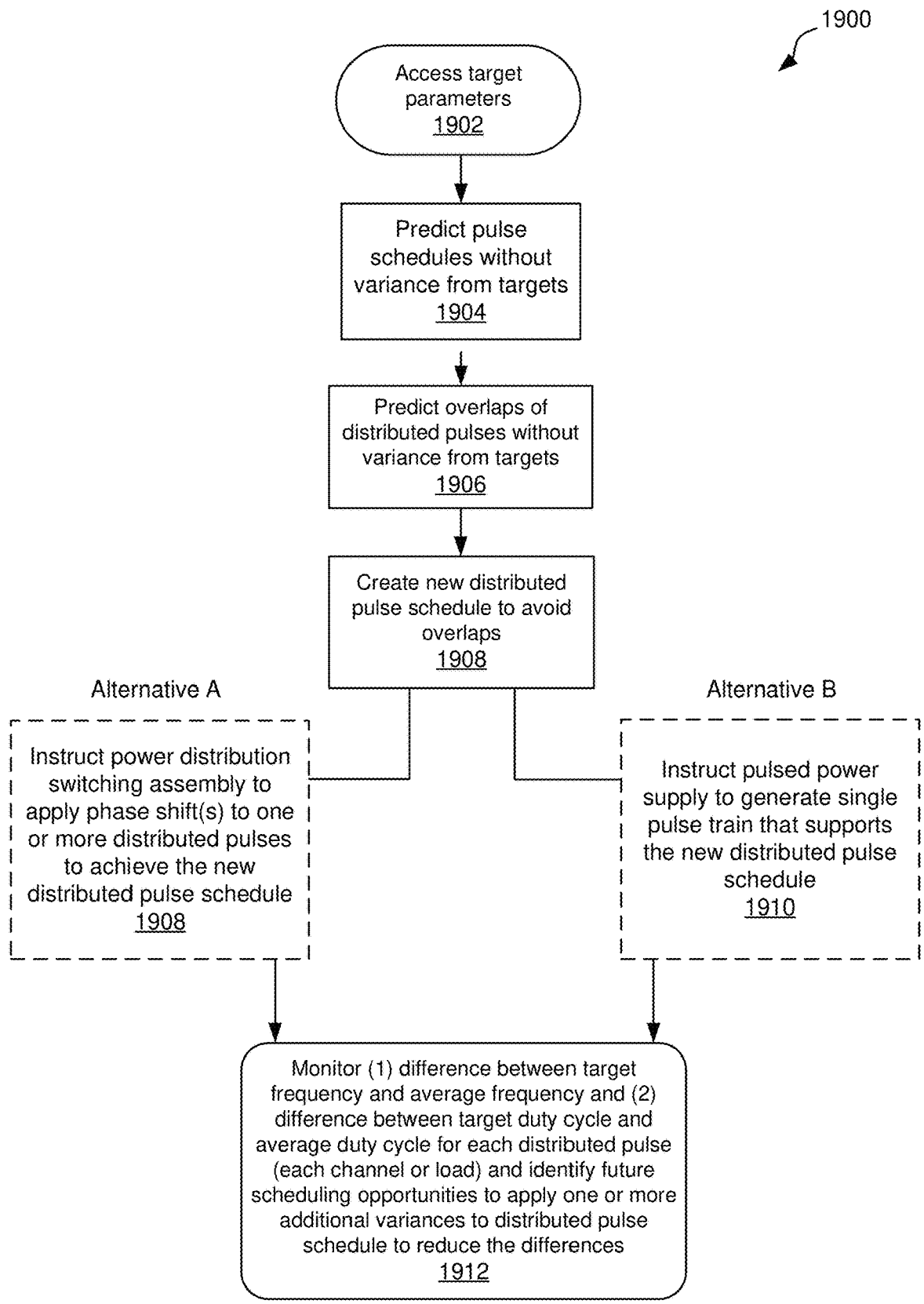
FIG. 19 illustrates a method for driving two or more distinct loads using a single pulsed power supply and avoiding overlapping pulses to the two or more distinct loads.

FIG. 19 illustrates a method for driving two or more distinct loads using a single pulsed power supply and avoiding overlapping pulses to the two or more distinct loads. The method 1900 can include accessing target parameters (e.g., frequency, duty cycle, conduction time, etc.) for each of the two or more distinct loads (Block 1902). This may involve turning to a memory of a multiplexing unit (e.g., memory 1806 in FIG. 18) and accessing stored parameters for each of a plurality of loads, including at least a target pulse frequency and/or a target pulse duty cycle, where the target pulse frequency and the target pulse duty cycle may be scheduled to change over time. An acceptable variance for these target parameters may also be accessed in the memory. The method 1900 may further include predicting instances of overlap between distributed pulses that are configured for provision to the two or more distinct loads if the target parameters are followed without variance (Block 1904). That is, a multiplexing unit can look at the target parameters for each load and predict when pulses for each load will occur if the target parameters are precisely followed (Block 1906). If one or more distributed pulses for different loads overlap in time (i.e., are scheduled to occur at least partially at the same time), then the method 1900 can instruct (1) a power distribution switching assembly (e.g., power distribution switching assembly 1810 in FIG. 18) to apply phase shifts to one or more of the distributed pulses to achieve the new distributed pulse schedule that avoids the overlap(s) (Block 1908) or (2) the pulsed power supply to apply a phase shift to one or more pulses in its single pulse train to avoid the overlap(s) (Block 1910). This may involve application of phase shifts or changes to frequency and/or duty cycle. These two alternatives 1908, 1910 allow either the pulsed power supply or the multiplexing unit to handle phase shifting or other pulse train alterations to avoid overlaps in distributed pulses.

Figure 20:
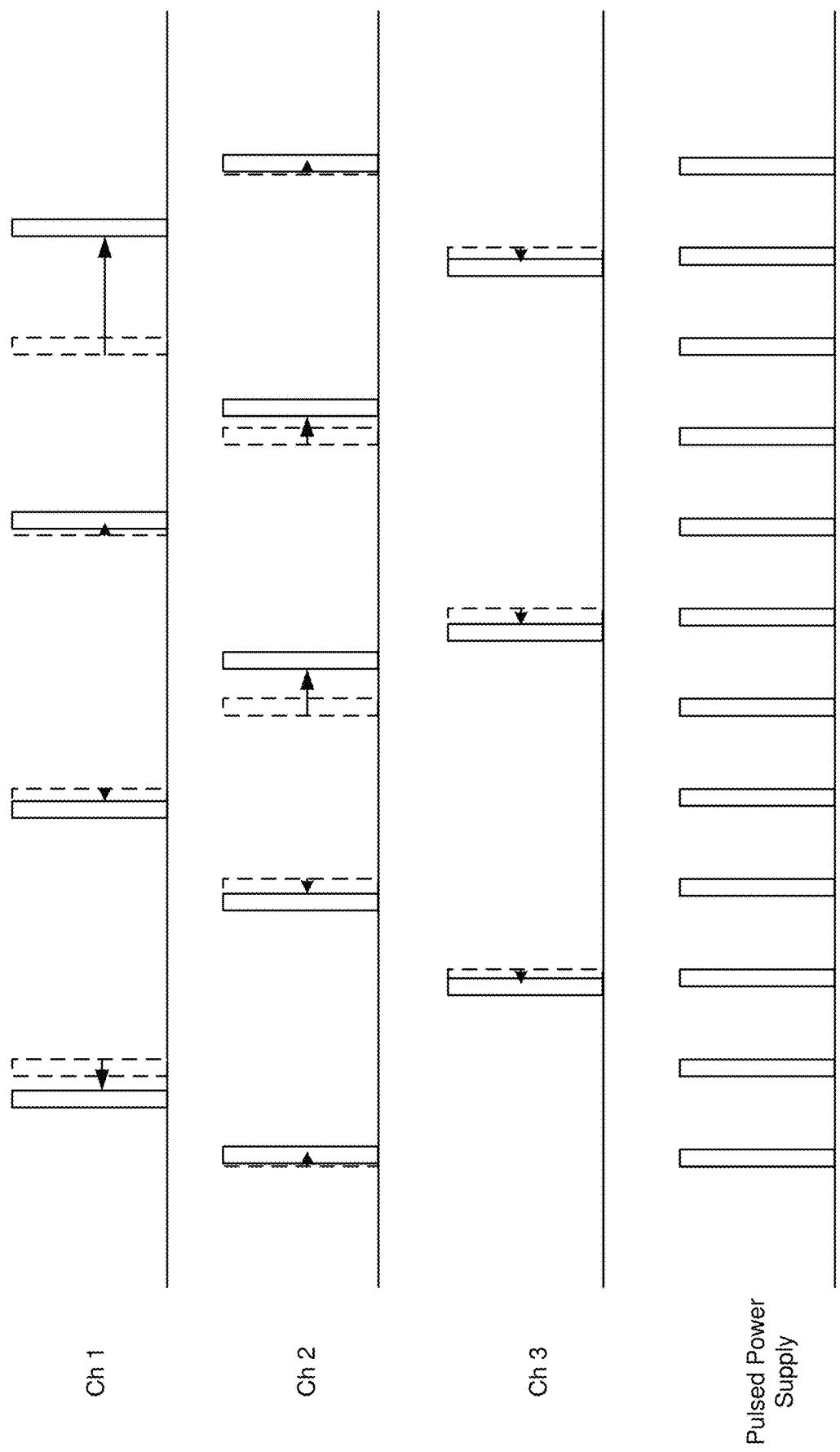
FIG. 20 illustrates a timing chart for a three-channel system where a multiplexing unit applies phase shifts to distributed pulses separated out from a periodic pulse train from a pulsed power supply.

For instance, in Alternative A, the multiplexing unit can take a periodic and unmodified pulse train from the pulsed power supply and not only distribute the pulses to two or more distinct loads as distributed pulses, but also apply internal phase shifts to those pulses so that the distributed pulses do not overlap. This alternative is exemplified by the timing chart in FIG. 20, where the pulsed power supply does not alter its pulse train, but instead provides a periodic pulse train that the multiplexing unit distributes and applies variances or phase shifts to in order to achieve the non-overlapping distributed pulses seen in Channels 1-3 (pulses in dashed lines show originally scheduled pulses without a variance applied). As shown the variances can be either forward or backward in time. However, in alternative embodiments it may be desirable to only apply delays (not shown), which could also be applied to FIG. 20, but simply using a different algorithm to determine variances.

Figure 21:
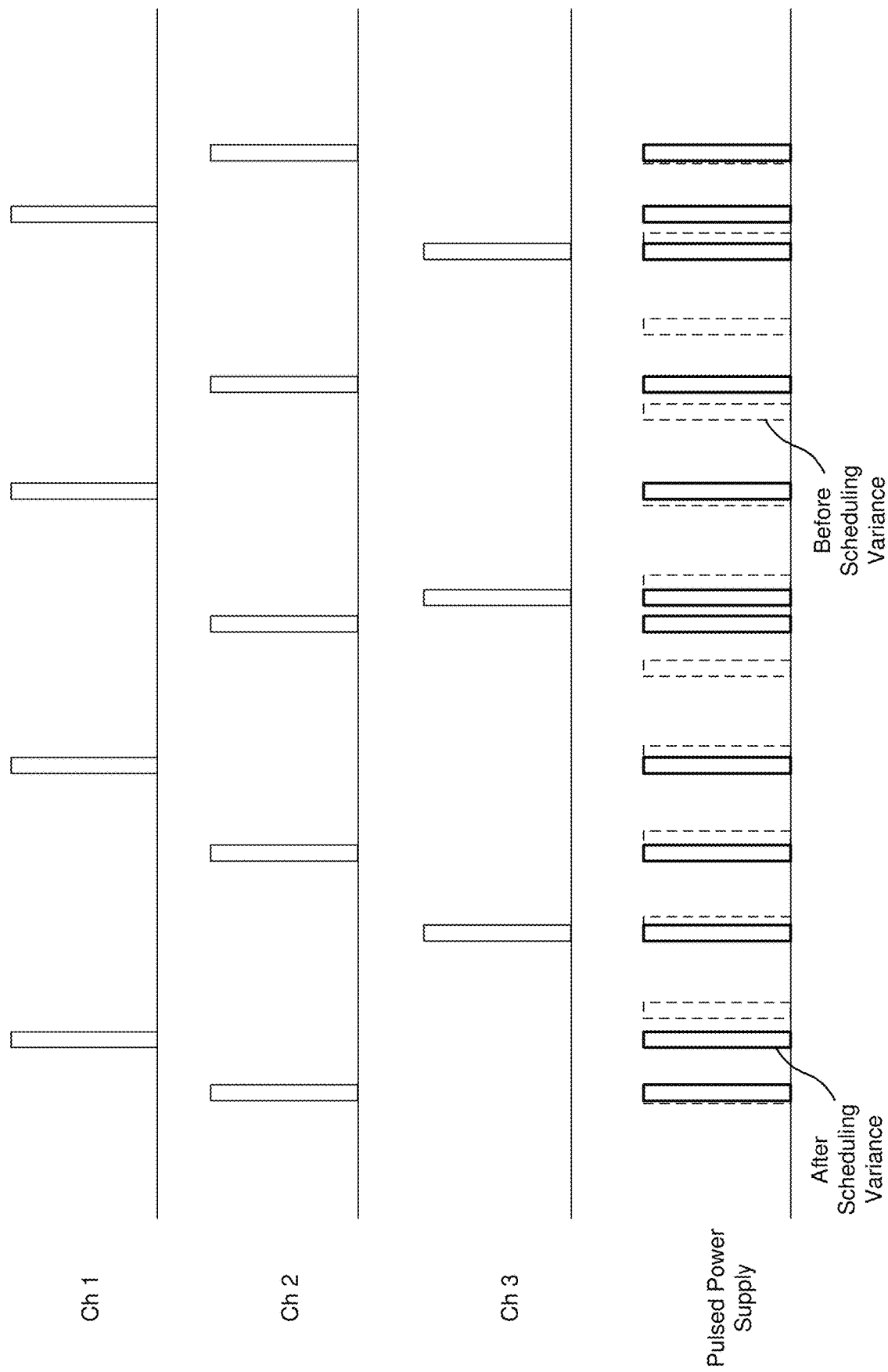
FIG. 21 illustrates a timing chart for a three-channel system where a pulsed power supply alters phases of its pulses and a multiplexing unit separates those pulses into distributed pulses without applying phase shifts in the multiplexing unit.

In Alternative B, the multiplexing unit passes instructions to the pulsed power supply to alter its single pulse train and then generate a modified pulse train that supports the distributed pulse schedule (e.g., via a power distribution switching assembly). For instance, FIG. 21 shows timing charts for a multiplexing unit (Channels 1-3) powering three distinct loads (channels 1, 2, and 3), and the pulsed power supply at the bottom of the four plots. The timing of the pulse train from the pulsed power supply can be periodic (see dashed pulses) before a variance is applied. However, with a schedule worked out by the multiplexing unit for the three channels as shown, where no overlap in pulses occurs, each channel is affected with different target parameters to its distributed pulse train. To do this, the pulsed power supply is instructed to apply variances to the pulse train to obtain a new pulse train that supports the scheduling of channels 1-3 (see solid pulses). When this modified pulse train reaches the multiplexing unit, the multiplexing unit merely distributes the pulses to the respective loads without applying any internal phase shifting.

Once the new schedule has been set and variances have been applied to achieve the schedule, the method 1900 can look to future opportunities to apply opposing variances or phase shifts to move an average frequency and/or target pulse duty cycle back toward the target pulse frequency and/or target pulse duty cycle for each channel (Block 1912). In particular, the method 1900 can monitor (1) differences between the target frequency and an average frequency of each distributed pulse train and (2) differences between the target duty cycle and an average duty cycle of each distributed pulse train. With these differences in hand, the method 1900 can look for future scheduling opportunities to apply one or more additional variances to the distributed pulse schedule to reduce those differences. For instance, if a first channel has seen a phase delay to avoid a first overlap with a second channel, then a future pulse for that channel could be hastened or phase shifted forward in time to move the average frequency back toward the target frequency. These future variances can be applied at the pulsed power supply or the power distribution switching assembly. The method 1900 can then repeat for additional pulse overlaps.

Figure 22:
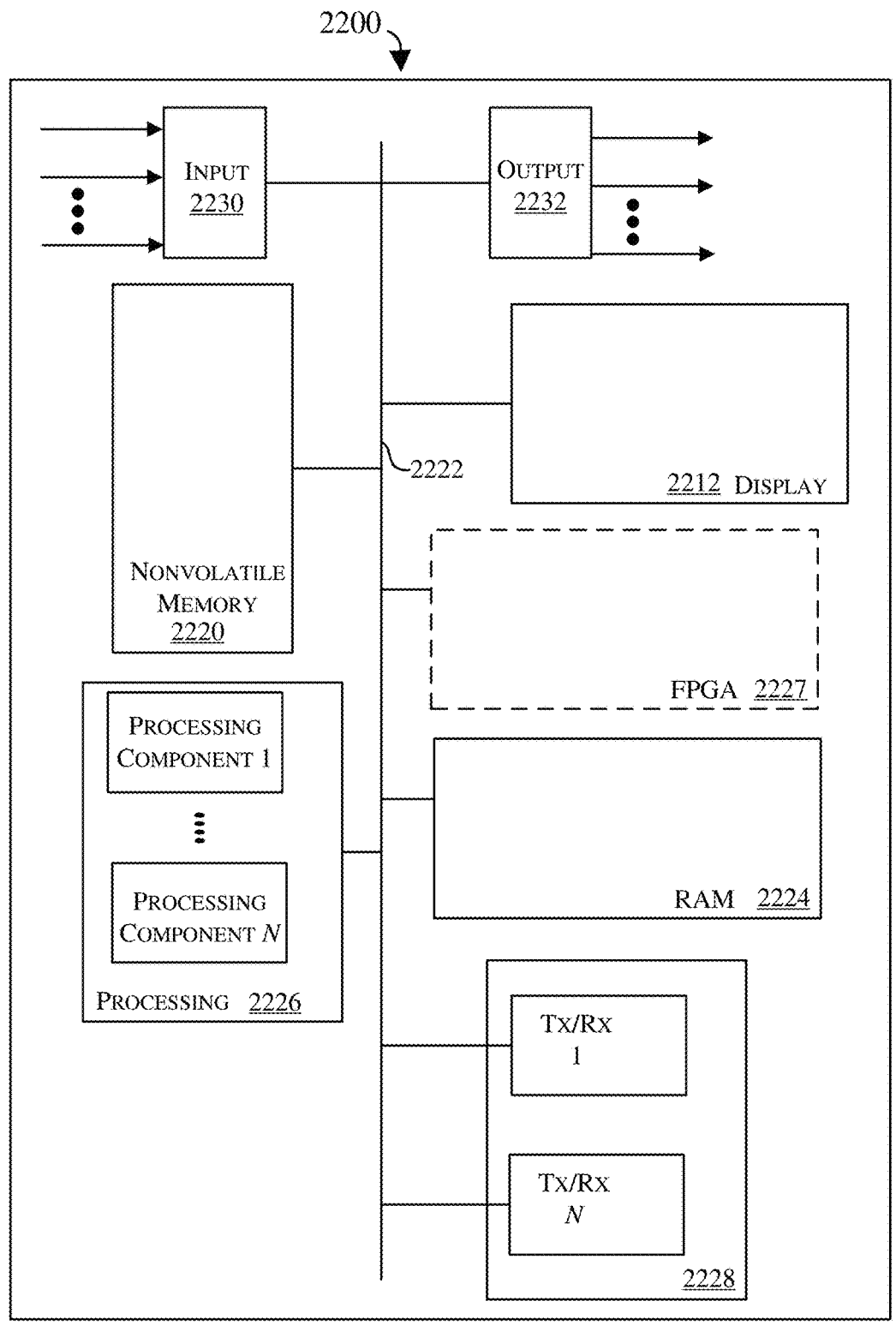
FIG. 22 shows a block diagram depicting physical components that may be utilized to realize the multiplexing units described throughout this disclosure.

The methods described in connection with the embodiments disclosed herein may be embodied directly in hardware, in processor-executable code encoded in a non-transitory tangible processor readable storage medium, or in a combination of the two. Referring to FIG. 22 for example, shown is a block diagram depicting physical components that may be utilized to realize the multiplexing units 104, 204, 304, 404, 1604, 1704 and 1804 according to an exemplary embodiment. As shown, in this embodiment a display portion 2212 and nonvolatile memory 2220 are coupled to a bus 2222 that is also coupled to random access memory ("RAM") 2224, a processing portion (which includes N processing components) 2226, an optional field programmable gate array (FPGA) 2227, and a transceiver component 2228 that includes N transceivers. Although the components depicted in FIG. 22 represent physical components, FIG. 22 is not intended to be a detailed hardware diagram; thus many of the components depicted in FIG. 22 may be realized by common constructs or distributed among additional physical components. Moreover, it is contemplated that other existing and yet-to-be developed physical components and architectures may be utilized to implement the functional components described with reference to FIG. 22.

This display portion 2212 generally operates to provide a user interface for a user, and in several implementations, the display is realized by a touchscreen display. In general, the nonvolatile memory 2220 is non-transitory memory that functions to store (e.g., persistently store) data and processor-executable code (including executable code that is associated with effectuating the methods described herein). In some embodiments for example, the nonvolatile memory 2220 includes bootloader code, operating system code, file system code, and non-transitory processor-executable code to facilitate the execution of a method described with reference to FIG. 13 or 14 described further herein.

In many implementations, the nonvolatile memory 2220 is realized by flash memory (e.g., NAND or ONENAND memory), but it is contemplated that other memory types may be utilized as well. Although it may be possible to execute the code from the nonvolatile memory 2220, the executable code in the nonvolatile memory is typically loaded into RAM 2224 and executed by one or more of the N processing components in the processing portion 2226.

The N processing components in connection with RAM 2224 generally operate to execute the instructions stored in nonvolatile memory 2220 to enable distribution of pulses from a single pulsed power supply to multiple loads. For example, non-transitory, processor-executable code to effectuate the methods described with reference to FIG. 13 or 14 may be persistently stored in nonvolatile memory 2220 and executed by the N processing components in connection with RAM 2224. As one of ordinarily skill in the art will appreciate, the processing portion 2226 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 2226 may be configured to effectuate one or more aspects of the methodologies described herein (e.g., the method described with reference to FIG. 13 or 14). For example, non-transitory processor-readable instructions may be stored in the nonvolatile memory 2220 or in RAM 2224 and when executed on the processing portion 2226, cause the processing portion 2226 to perform multiplexing of pulsed power to feed multiple loads without overlap in pulses to the multiple loads and while attempting to maintain average duty cycles and/or frequencies to each of the loads. Alternatively, non-transitory FPGA-configuration-instructions may be persistently stored in nonvolatile memory 2220 and accessed by the processing portion 2226 (e.g., during boot up) to configure the hardware-configurable portions of the processing portion 2226 to effectuate the functions of the multiplexing unit 104, 204, 304, 404, 1604, 1704 and 1804.

The input component 2230 operates to receive signals (e.g., the comms signal at output 316) that are indicative of one or more aspects of a set of pulses from the single pulsed power supply 102. The signals received at the input component may include, for example, indications of the target parameters or a channel identifier. The output component generally operates to provide one or more analog or digital signals to effectuate an operational aspect of the multiplexing unit 104, 204, 304, 404, 1604, 1704 and 1804 such as control signals sent to the power distribution switching assembly 310 and/or the single pulsed power supply 102. For example, the output portion 2232 may provide instructions to the power distribution switching assembly 310 to effectuate a desired distribution of pulses to multiple loads or to instruct the single pulsed power supply 102 to alter a pattern of its pulses.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A pulsed power supply assembly configured to couple to and drive two or more loads, the pulsed power supply assembly comprising:
    a multiplexing unit comprising:
        two or more pulsed outputs each configured for coupling to one of the two or more loads;
        a power distribution switching assembly coupled to an input of the multiplexing unit and the two or more pulsed outputs and configured to split pulses from a pulse train received at the input into distributed pulses at the two or more pulsed outputs;
    a pulsed power supply configured to provide the pulse train to the input of the multiplexing unit, the pulsed power supply comprising:
        a periodic pulse generator;
        phase shift circuitry coupled to an output of the periodic pulse generator and coupled to an output of the pulsed power supply;
        a memory storing target parameters for each of the two or more loads; and
        a processing portion coupled to the memory and reading processor executable instructions on the memory, that when executed, cause the processing portion to:
            access the target parameters in the memory;
            generate a schedule of distributed pulses for the multiplexing unit;
            predict instances of overlap between the distributed pulses in the schedule;
            generate a new schedule that avoids the instances of overlap; and
            instruct the phase shift circuitry to modify a periodic pulse train from the periodic pulse generator to generate the pulse train such that the pulse train aligns with the new schedule.

2. The pulsed power supply assembly of claim 1, wherein, when executed, the processor executable instructions on the memory further cause the processing portion to indicate to the multiplexing unit which of the two or more pulsed outputs the multiplexing unit should distribute each pulse from the pulse train to.

3. The pulsed power supply assembly of claim 2, wherein to modify the periodic pulse train includes applying a phase shift to one or more pulses in the periodic pulse train.

4. The pulsed power supply assembly of claim 1, wherein the new schedule is tailored to stay within an acceptable variance of the target parameters.

5. The pulsed power supply assembly of claim 1, wherein the target parameters include a frequency of pulses for each of the distributed pulses.

6. The pulsed power supply assembly of claim 1, wherein the target parameters include an on time and an off time of pulses for each of the distributed pulses.

7. The pulsed power supply assembly of claim 1, wherein the multiplexing unit is part of the pulsed power supply.

8. A pulsed power supply assembly configured to couple to and drive two or more loads, the pulsed power supply assembly comprising:
    a multiplexing unit comprising:
        two or more pulsed outputs each configured for coupling to one of the two or more loads;
        a power distribution switching assembly coupled to an input of the multiplexing unit and the two or more pulsed outputs and configured to split pulses from a pulse train received at the input into distributed pulses at the two or more pulsed outputs; and
    a pulsed power supply configured to provide the pulse train to the input of the multiplexing unit, the pulsed power supply comprising:
        a means for generating the pulse train;
        a memory configured to store target parameters for the two or more loads;
        a processing portion configured to:
            access the target parameters and predict a schedule of distributed pulses for the two or more loads;
            identify one or more overlaps between pulses in different ones of the distributed pulses; and
            instruct the means for generating the pulse train to apply a phase shift to one or more pulses in the pulse train such that the one or more overlaps do not occur when the power distribution switching assembly splits up the pulse train into the distributed pulses.

9. The pulsed power supply assembly of claim 8, wherein the processing portion is further configured to indicate to the multiplexing unit which of the two or more pulsed outputs the multiplexing unit should distribute each pulse from the pulse train to.

10. The pulsed power supply assembly of claim 8, further comprising applying the phase shift while keeping average parameters for the distributed pulses within variances stored in the memory.

11. The pulsed power supply assembly of claim 8, wherein the target parameters include a frequency of pulses for each of the distributed pulses.

12. The pulsed power supply assembly of claim 8, wherein the target parameters include an on time and an off time of pulses for each of the distributed pulses.

13. The pulsed power supply assembly of claim 8, wherein the multiplexing unit is part of the pulsed power supply.

14. A non-transitory, tangible computer readable storage medium, encoded with processor readable instructions to perform a method for driving two or more distinct loads using a single pulsed power supply and avoiding overlapping pulses to the two or more distinct loads, the method comprising:
    accessing target parameters for each of the two or more distinct loads;
    predicting instances of overlap between distributed pulses configured for provision to the two or more distinct loads if the target parameters are followed without variance, the distributed pulses being formed from a single pulse train;

scheduling a variance into a schedule of the distributed pulses to avoid the instances of overlap; and instructing a power distribution switching assembly to distribute pulses in the single pulse train to the two or more distinct loads according to the schedule.

15. The non-transitory, tangible computer readable storage medium of claim 14, wherein the power distribution switching assembly is part of a multiplexing unit having outputs coupled to the two or more distinct loads.

16. The non-transitory, tangible computer readable storage medium of claim 15, wherein the multiplexing unit is coupled to an output of the single pulsed power supply.

17. The non-transitory, tangible computer readable storage medium of claim 15, wherein the multiplexing unit is a part of the single pulsed power supply.

18. The non-transitory, tangible computer readable storage medium of claim 14, wherein the variance is no greater than a variance threshold from the target parameters.

19. The non-transitory, tangible computer readable storage medium of claim 14, wherein the scheduling is tailored to keep average parameters of the distributed pulses to within a variance of the target parameters.

* * * * *